(12) United States Patent
Polney

(10) Patent No.: US 9,818,462 B1
(45) Date of Patent: Nov. 14, 2017

(54) APPARATUSES AND METHODS FOR PROVIDING INTERNAL CLOCK SIGNALS OF DIFFERENT CLOCK FREQUENCIES IN A MEMORY DEVICE

(71) Applicant: Micron Technology, Inc., Boise, ID (US)

(72) Inventor: Jens Polney, Feldkirchen (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/410,602

(22) Filed: Jan. 19, 2017

(51) Int. Cl.
*G11C 7/10* (2006.01)
*G11C 7/22* (2006.01)
*G11C 8/18* (2006.01)

(52) U.S. Cl.
CPC .......... *G11C 7/222* (2013.01); *G11C 7/1051* (2013.01); *G11C 7/1084* (2013.01); *G11C 8/18* (2013.01); *G11C 7/1078* (2013.01); *G11C 7/22* (2013.01)

(58) Field of Classification Search
CPC ........ G11C 7/1051; G11C 7/1078; G11C 7/22
USPC .......................... 365/189.05, 230.08, 233.13
See application file for complete search history.

(56) References Cited

U.S. PATENT DOCUMENTS

2010/0250874 A1* 9/2010 Farrell ................... G06F 13/161
711/155

* cited by examiner

*Primary Examiner* — Jason Lappas
(74) *Attorney, Agent, or Firm* — Dorsey & Whitney LLP

(57) ABSTRACT

Apparatuses and methods for providing internal clock signals of different clock frequencies in a semiconductor device are described in the present application. An example apparatus includes a read command buffer and a read data output circuit. The read command buffer buffers a read command responsive to a first clock signal and provides the read command responsive to a second clock signal. The read data output circuit receives a plurality of bits of data in parallel when activated by the read command from the read command buffer, and provides the plurality of bits of data serially responsive to input/output (IO) clock signals. A data clock timing circuit provides the IO clock signals having a first clock frequency in a first mode and having a second clock frequency in a second mode, and further provides the second clock signal having the first clock frequency in the first and second modes.

9 Claims, 15 Drawing Sheets

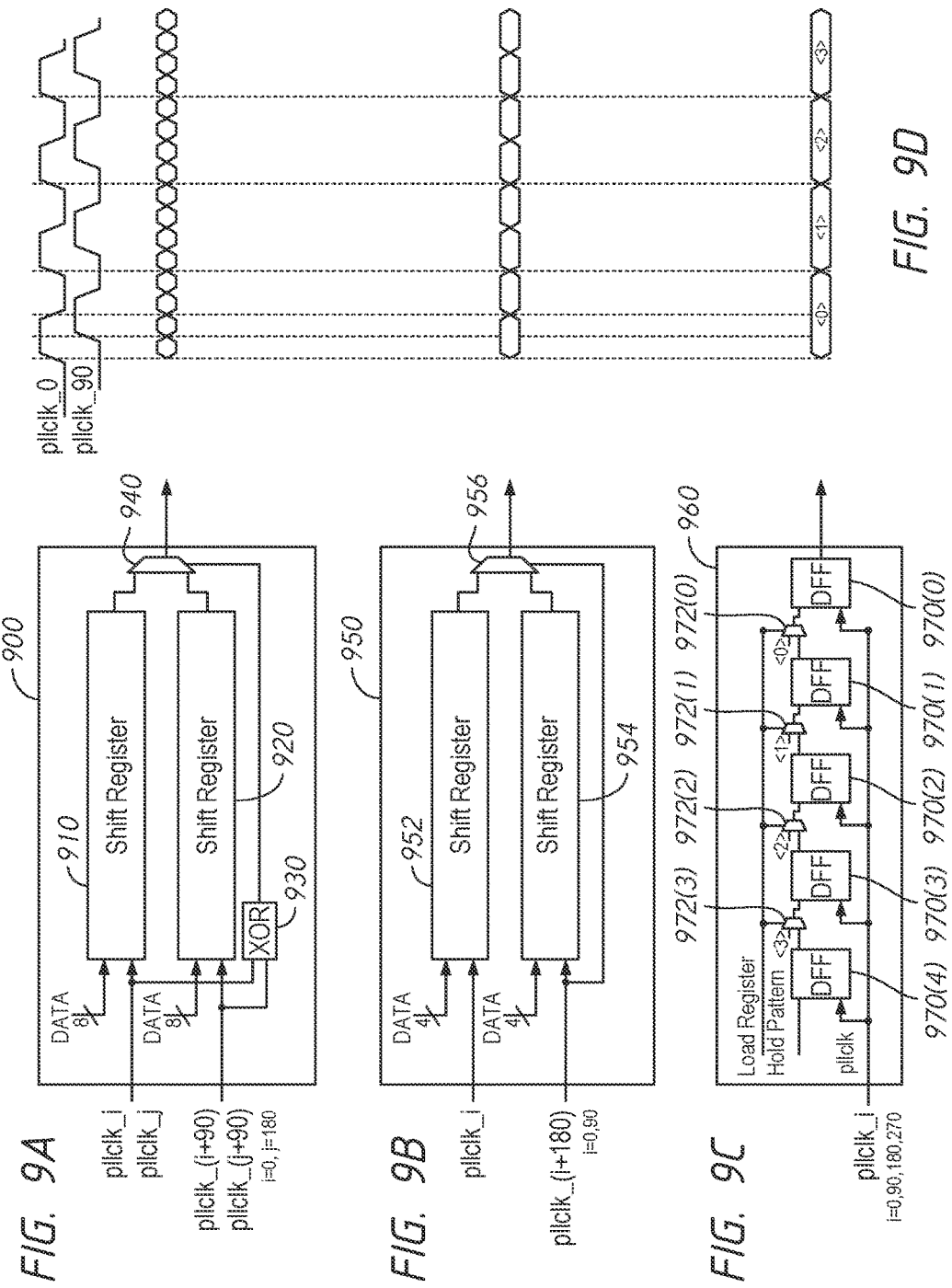

APPARATUSES AND METHODS FOR PROVIDING INTERNAL CLOCK SIGNALS OF DIFFERENT CLOCK FREQUENCIES IN A MEMORY DEVICE

BACKGROUND

Current and future generation semiconductor memory applications utilize very high memory I/O speeds to read and write data. Examples of such semiconductor memory include dynamic random access memory (DRAM) and synchronous dynamic random access memory (SDRAM), as well as many others.

The demand for high memory I/O speeds is particularly true in graphics memory, such as current and future generation GDDR5/GDDR5X specifications. Graphics memories are designed for applications requiring high bandwidths and high memory I/O speeds, for example, in excess of 8 Gbps. The high memory I/O speeds, however, consume more power than compared to lower memory I/O speeds. While many applications of such memory demand high memory I/O speeds, other applications may prioritize lower power consumption and accept lower memory I/O speeds.

It may be desirable for a semiconductor memory to be operated at various clock frequencies to provide different memory I/O speeds.

BRIEF DESCRIPTION OF THE DRAWINGS

FIG. 9A is a block diagram of a read data output circuit according to an embodiment of the disclosure.

FIG. 9B is a block diagram of a shift register according to an embodiment of the disclosure.

FIG. 9C is a block diagram of a shift register according to an embodiment of the disclosure.

FIG. 9D is a timing diagram illustrating the timing of the output of the bits of data by the shift register of FIG. 9A, the shift register of FIG. 9B, and the shift register of FIG. 9C relative to one another.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
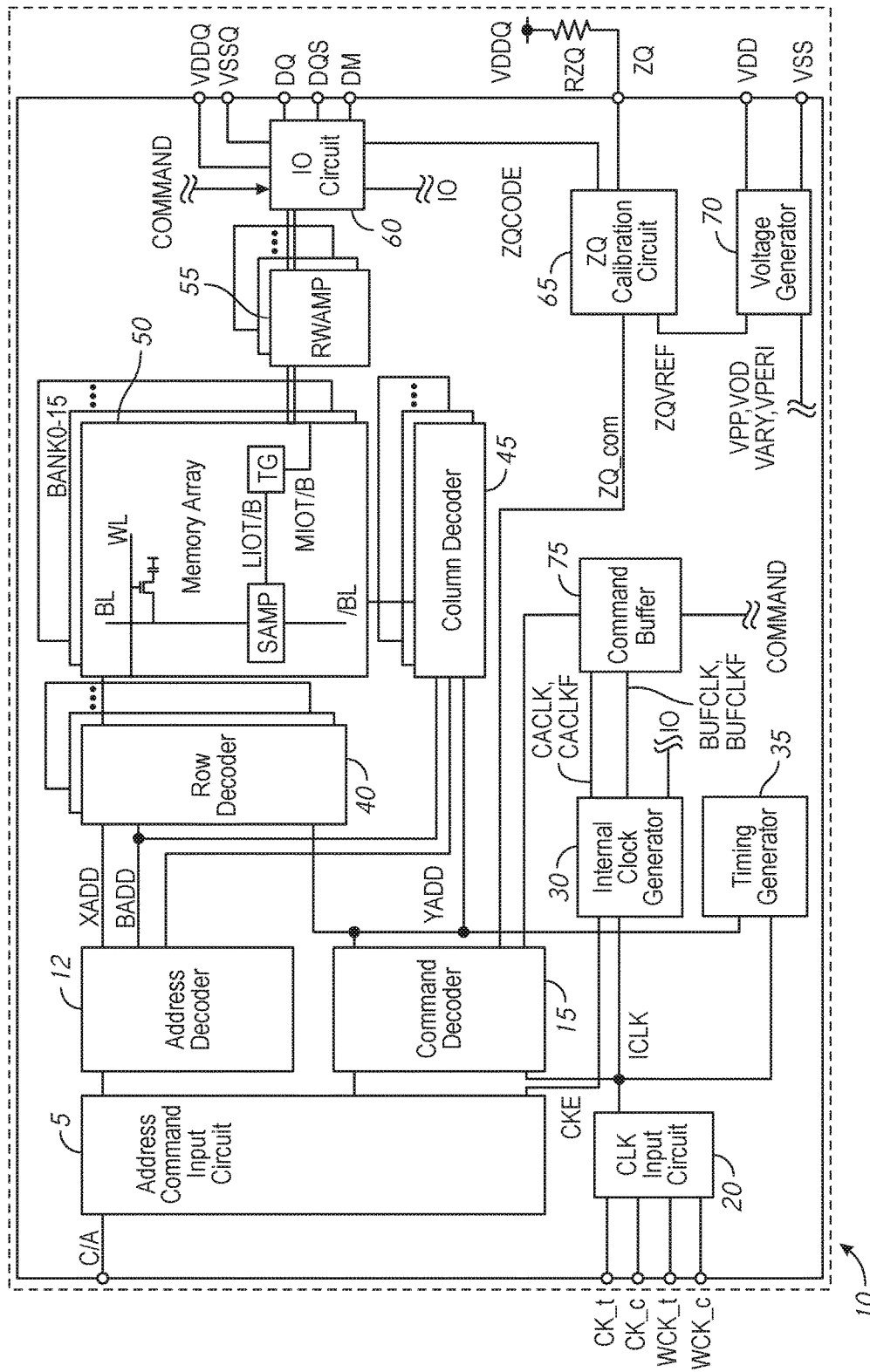
FIG. 1 is a block diagram of a block diagram of a semiconductor device in accordance with an embodiment of the disclosure.

FIG. 1 is a block diagram of a block diagram of a semiconductor device 10 in accordance with an embodiment of the disclosure. The semiconductor device 10 includes a memory die. The memory die may include an address/command input circuit 5, address decoder 12, command decoder 15, clock input circuit 20, internal clock generator 30, timing generator 35, row decoder 40, column decoder 45, memory arrays 50, read/write amplifiers 55, I/O circuit 60, ZQ calibration circuit 65, and voltage generator 70.

In some embodiments, the semiconductor device 10 may include, without limitation, a DRAM device, such as GDDR5 SGRAM integrated into a single semiconductor chip, for example. GDDR SGRAMs may be suited for use with high-performance computing applications, including, for example, graphics intensive processing applications such as graphics cards, game consoles, and the like. The die may be mounted on an external substrate, for example, a memory module substrate, a mother board or the like. The semiconductor device 10 may further include a memory array 50. The memory array 50 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 40 and the selection of the bit line BL is performed by a column decoder 45. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 10 may employ a plurality of external terminals that include address and command terminals coupled to command/address bus (C/A), clock terminals CK_t and CK_c, write clock terminals WCK_t and WCK_c, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 5, to an address decoder 12. The address decoder 12 receives the address signal and supplies a decoded row address signal to the row decoder 40, and a decoded column address signal to the column decoder 45. The address decoder 12 also receives the bank address signal and supplies the bank address signal to the row decoder 40, the column decoder 45.

The command/address terminals may further be supplied with a command signal from outside, such as, for example, a memory controller 5. The command signal may be provided, via the C/A bus, to the command decoder 15 via the address/command input circuit 5. The command decoder 15 decodes the command signal to generate various internal commands that include a row command signal to select a word line and a column command signal, such as a read command or a write command, to select a bit line. Various internal commands, for example read commands and write commands, are provided to a command buffer 75. The buffered commands are buffered by the command buffer 75 responsive to command and address clock signals CACLK and CACLKF and output responsive to buffer clock signals BUFCLK and BUFCLKF. The commands are provided to various circuits of the semiconductor device to perform operations related to the commands.

For example, when a read command is issued and a row address and a column address are timely supplied with the read command, read data is read from a memory cell in the memory array 50 designated by these row address and column address. An internal read command is buffered and then provided to input/output circuit 60 so that the read data DQ is output to outside from the data terminals DQ, DQS, and DM via read/write amplifiers 55 and the input/output circuit 60. Similarly, when the write command is issued and a row address and a column address are timely supplied with this command, and then write data is supplied to the data terminals DQ, DQS, DM, an internal write command is buffered and then provided to input/output circuit 60 so that the write data is received by data receivers in the input/output circuit 60, and supplied via the input/output circuit 60 and the read/write amplifiers 55 to the memory array 50 and written in the memory cell designated by the row address and the column address.

Turning to the explanation of the external terminals included in the semiconductor device 10, the clock terminals CK_t and CK_c, and WCK_t and WCK_c are supplied with external clock signals and complementary external clock signals, respectively. The external clock signals (including complementary external clock signals) may be supplied to a clock input circuit 20. The clock input circuit 20 may receive the external clock signals to generate internal clock signals ICLK. The internal clock signals ICLK are supplied to an internal clock generator 30. The internal clock generator 30 provides various phase and frequency controlled internal clock signal based on the received internal clock signals ICLK and a clock enable signal CKE from the address/command input circuit 5. For example, the internal clock generator 30 provides command and address clock signals CACLK, CACLKF and buffer clock signals BUFCLK, BUFCLKF. The internal clock generator 30 further provides input/output (IO) clock signals. The IO clock signals are supplied to the input/output circuit 60 and are used as a timing signal for determining an output timing of read data and the input timing of write data. As will be described in more detail below, the IO clock signals may be provided at multiple clock frequencies so that data may be output from and input to the semiconductor device 10 at different data rates. A higher clock frequency may be desirable when high memory speed is critical. A lower clock frequency may be desirable when lower power consumption is critical. The internal clock signals ICLK are also supplied to a timing generator 35 and thus various internal clock signals can be generated.

The power supply terminals are supplied with power supply potentials VDD and VSS. These power supply potentials VDD and VSS are supplied to an internal voltage generator circuit 70. The internal voltage generator circuit 70 generates various internal potentials VPP, VOD, VARY, VPERI, and the like and a reference potential ZQVREF based on the power supply potentials VDD and VSS. The internal potential VPP is mainly used in the row decoder 40, the internal potentials VOD and VARY are mainly used in the sense amplifiers included in the memory array 50, and the internal potential VPERI is used in many other circuit blocks. The reference potential ZQVREF is used in the ZQ calibration circuit 65.

The power supply terminals are also supplied with power supply potentials VDDQ and VSSQ. These power supply potentials VDDQ and VSSQ are supplied to the input/output circuit 60. The power supply potentials VDDQ and VSSQ are the same potentials as the power supply potentials VDD and VSS, respectively. However, the dedicated power supply potentials VDDQ and VSSQ are used for the input/output circuit 60 so that power supply noise generated by the input/output circuit 60 does not propagate to the other circuit blocks.

The calibration terminal ZQ is connected to the ZQ calibration circuit 65. The ZQ calibration circuit 65 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 60, and thus an impedance of an output buffer (not shown) included in the input/output circuit 60 is specified.

Figure 2:
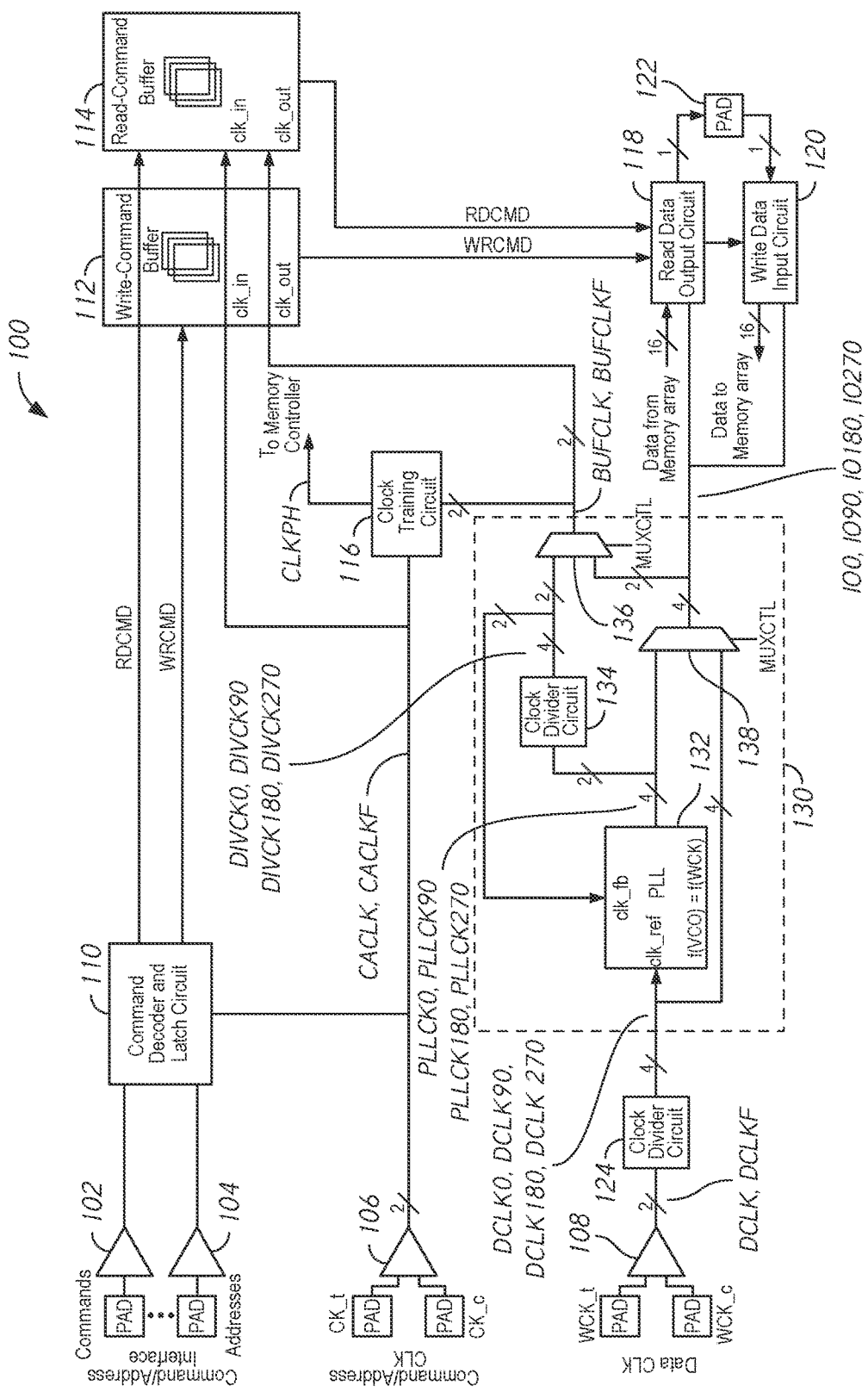
FIG. 2 is a block diagram of an apparatus according to an embodiment of the disclosure.

FIG. 2 is a block diagram of an apparatus 100 according to an embodiment of the disclosure. The apparatus 100 may be included in the semiconductor device 10 of FIG. 1 in some embodiments. The apparatus 100 includes a command path that includes receiver circuits 102 and 104 that receive command signals and address signals, respectively. The receiver circuit 102 may include a plurality of receiver circuits that each receive a respective one of the command signals, and similarly, the receiver circuit 104 may include a plurality of receiver circuits that each receive a respective one of the address signals. The receiver circuit 102 provides the command signals and the receiver circuit 104 provides the address signals to a command decoder and latch circuit 110. The apparatus 100 further includes receiver circuit 106 that receives a command and address clock signal CK_t and a complementary command and address clock signal CK_c. The receiver circuit 106 provides two internal clock signals CACLK and CACLKF having relative phases to each other (i.e., provides two phases). For example, in an embodiment of the disclosure, the receiver circuit 106 provides the CACLK clock signal and further provides the CACLKF clock signal, which is 180 degrees out of phase from the CACLK clock signal.

The command signals and address signals provided by the receiver circuits 102 and 104, respectively, are latched by the command decoder and latch circuit 110 responsive to the CACLK and/or CACLKF clock signals. The command decoder and latch circuit 110 provides internal commands based on the latched command signals. For example, the command decoder and latch circuit 110 provides an internal read command RDCMD responsive to the command decoder and latch circuit 110 decoding a read command from the latched command signals. The command decoder and latch circuit 110 provides an internal write command WRCMD responsive to the command decoder and latch circuit 110 decoding a write command from the latched command signals. The internal commands, namely the read command RDCMD and write command WRCMD, have been provided by way of example, and are not intended to limit the internal commands provided by the command decoder and latch circuit 110 to merely read and write commands. In an embodiment, the command decoder and latch circuit 110 provides other internal commands additionally, or alternatively, to the read command RDCMD and/or write command WRCMD.

The read command RDCMD is provided to a read command buffer 114. The read command buffer 114 may be implemented as a first-in, first-out (FIFO) buffer. The read command buffer 114 buffers a read command RDCMD responsive to a clock signal provided to a clk_in node of the read command buffer 114 and provides a read command RDCMD responsive to a clock signal provided to a clk_out node of the read command buffer 114. The CACLK clock signal and/or CACLKF clock signal are provided to the clk_in node of the read command buffer 114. The write command signal WRCMD is provided to a write command buffer 112. The write command buffer 112 may be implemented as a FIFO buffer. The write command buffer 112 buffers a write command WRCMD responsive to a clock signal provided to a clk_in node of the write command buffer 112 and provides a write command WRCMD responsive to a clock signal provided to a clk_out node of the write command buffer 112. The CACLK clock signal and/or CACLKF clock signal are provided to the clk_in node of the write command buffer 112.

The read command RDCMD is provided by the read command buffer 114 to a read data output circuit 118 responsive to the clock signal provided to the clk_out node. The read data output circuit 118 receives read data, for example, from a memory array, and provides the read data to an external terminal 122 when activated by the read command RDCMD and responsive to a clock signal provided to a clock input of the read data output circuit 118. In an embodiment, the read data output circuit 118 receives read data in parallel (e.g., 16-bits in parallel) and provides the read data to the external terminal 122 serially (e.g., multiple consecutive 1-bit output). The write command WRCMD is provided by the write command buffer 112 to a write data input circuit 120 responsive to a clock signal provided to the clk_out node. The write data input circuit 120 receives write data, for example, from the external terminal 122, and provides the write data internally, for example, to the memory array, when activated by the write command WRCMD and responsive to a clock signal provided to a clock input of the write data input circuit 120. In an embodiment, the write data input circuit 120 receives write data serially (multiple consecutive 1-bit input) and provides the internal write data in parallel (e.g., 16-bits in parallel).

Figure 5:
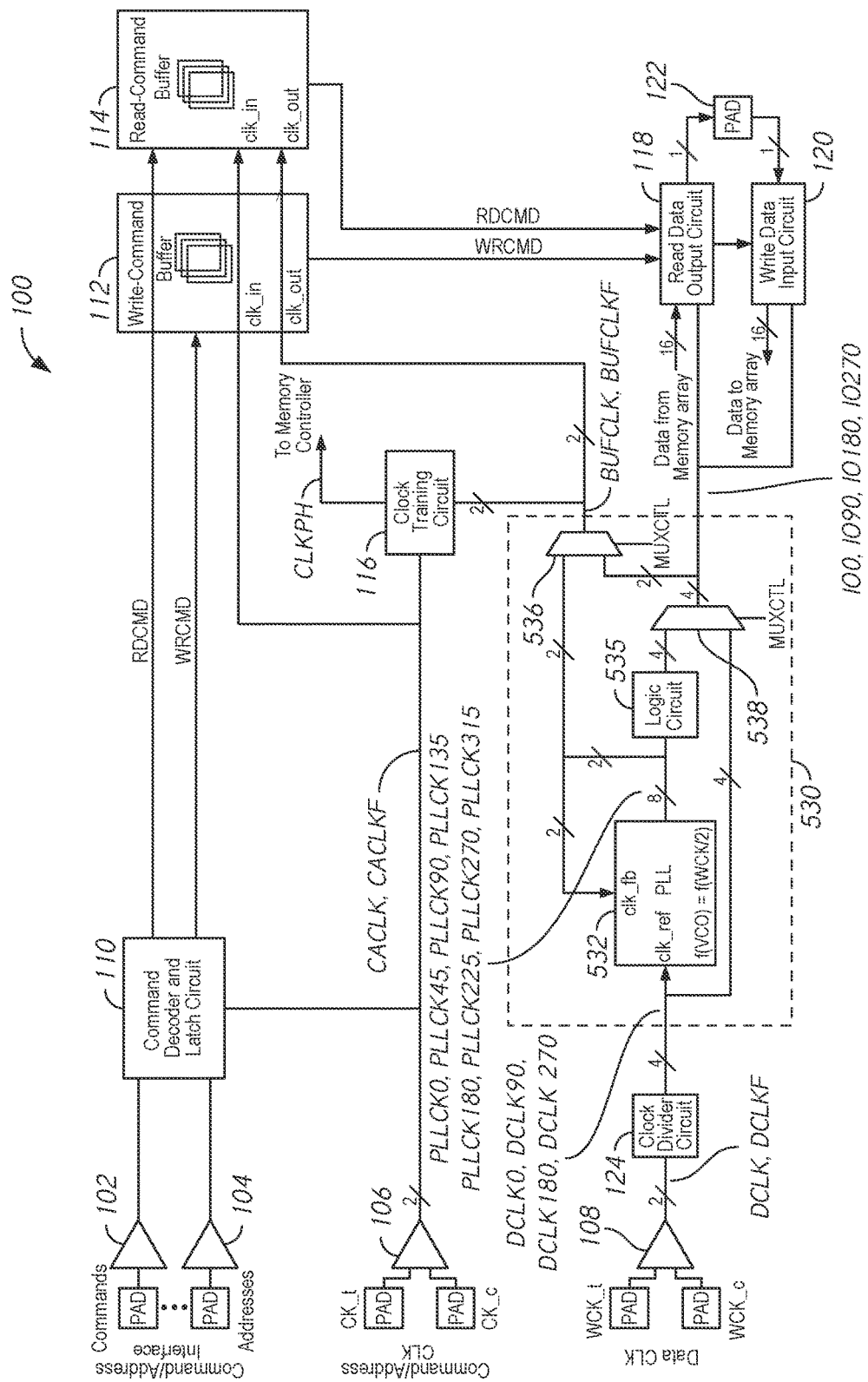
FIG. 5 is block diagram of an apparatus according to an embodiment of the disclosure.

It will be appreciated that while FIGS. 2 and 5 illustrate one external terminal 122, and respective read data output circuit 118 and write data input circuit 120, additional external terminals, and read data output circuits and write data output circuits may be included when the apparatus 100 is included in a semiconductor device, for example, the semiconductor device 10 of FIG. 1, without departing from the scope of the disclosure. The IO clock signals may be provided to each of the read data output circuits and write data input circuits in such embodiments. Similarly, other circuits or elements previously described with reference to FIGS. 2 and 5 may be added to support additional read data output circuits and write data input circuits, and additional external terminals without departing from the scope of the present disclosure.

The apparatus 100 further includes a clock training circuit 116 that receives the CACLK and CACLKF clock signals, and further receives buffer clock signals BUFCLK and BUFCLKF. The clock training circuit 116 compares the CACLK and CACLKF clock signals with the BUFCLK and BUFCLKF clock signals and provide a clock phase signal CLKPH having a value indicative of the phase relationship between the CACLK, CACLKF and BUFCLK, BUFCLKF clock signals. For example, the CLKPH signal may have a first logic value when the CACLK, CACLKF clock signals lead the BUFCLK, BUFCLKF clock signals and may have a second logic value when the CACLK, CACLKF clock signals lag the BUFCLK, BUFCLKF clock signals. The CLKPH signal may be provided to a memory controller that adjusts the phase of a data clock (e.g., write clock signals WCK_t and WCK_c) and the command and address clock signal.

A receiver circuit 108 receives a write clock signal WCK_t and a complementary write clock signal WCK_c. The receiver circuit 108 provides two internal clock signals DCLK and DCLKF having relative phases to each other (i.e., provides two phases). For example, in an embodiment of the disclosure, the receiver circuit 108 provides the DCLK clock signal and further provides the DCLKF clock signal, which is 180 degrees out of phase from the DCLK clock signal. The DCLK and DCLKF clock signals have a clock frequency that is the same as the clock frequency of the WCK_t and WCK_c clock signals. By way of a non-limiting example, the clock frequency of the DCLK and DCLKF clock signals and the clock frequency of the WCK_t and WCK_c clock signals may be 3 GHz. The DCLK and DCLKF clock signals are provided to a clock divider circuit 124, which provides four clock signals DCLK0, DCLK90, DCLK180, and DCLK270 having relative phases to each other (e.g., four phase clock signals). For example, in an embodiment of the disclosure, the clock divider circuit 124 provides the DCLK0 clock signal, the DCLK90 clock signal that is 90 degrees out of phase from the DCLK0 clock signal, and further provides the DCLK180 clock signal that is 180 degrees out of phase from the DCLK0 clock signal and the DCLK270 clock signal that is 270 degrees out of phase from the DCLK0 clock signal. The four clock signals provided by the clock divider circuit 124 have a lower clock frequency than the clock frequency of the DCLK and DCLKF clock signals. For example, in an embodiment of the disclosure, the clock divider circuit 124 provides four clock signals DCLK0, DCLK90, DCLK180, DCLK270 having a clock frequency that is one-half of the clock frequency of the DCLK and DCLKF clock signals (and one-half of the WCK_t and WCK_c clock signals). By way of a non-limiting example, the clock frequency of the DCLK and DCLKF clock signals (and one-half of the WCK_t and WCK_c clock signals) may be 3 GHz and the clock frequency of the DCLK0, DCLK90, DCLK180, DCLK270 clock signals may be 1.5 GHz.

The four clock signals from the clock divider circuit 124 are provided to a data clock timing circuit 130. The data clock timing circuit 130 provides buffer clock signals BUFCLK and BUFCLKF. The BUFCLK and BUFCLKF signals are provided to the clock training circuit 116, and to the write command buffer 112 and read command buffer 114. The BUFCLK and BUFCLKF signals and the CACLK and CACLKF signals are compared by the clock training circuit 116 when activated to provide the clock phase signal CLKPH, which as previously described, may have a value indicative of the phase of relationship between the BUFCLK, BUFCLKF signals and the CACLK, CACLKF signals. The BUFCLK and BUFCLKF signals are also used to cause the write command buffer 112 to provide write commands to the write data input circuit 120 and to cause the read command buffer 114 to provide read commands to the read data output circuit 118.

The data clock timing circuit 130 further provides input/output (IO) clock signals IO0, IO90, IO180, and IO270. The IO clock signals have relative phases to each other (e.g., four phase clock signals). For example, in an embodiment of the disclosure, the data clock timing circuit 130 provides the IO0 clock signal, and provides the IO90 clock signal that is 90 degrees out of phase from the IO0 clock signal, the IO180 clock signal that is 180 degrees out of phase from the IO0 clock signal, and the IO270 clock signal that is 270 degrees out of phase from the IO0 clock signal. The IO clock signals are provided to the clock input of the write data input circuit 120 and to the clock input of the read data output circuit 118. As previously described, the write data input circuit 120 provides write data from the external terminal 122 responsive to the IO clock signals when activated by the write command WRCMD and the read data output circuit 118 provides read data to the external terminal 122 responsive to the IO clock signals when activated by the read command RDCMD.

As will be described in more detail below, the data clock timing circuit 130 is configured to provide the IO clock signals and the BUFCLK and BUFCLKF clock signals to cause the read data output circuit 118 and the write data input circuit 120 to operate at a first clock frequency when in a first mode, and to operate at a second clock frequency when in a second mode. For example, in an embodiment, when in the first mode the data clock timing circuit 130 is configured to provide the IO clock signals and the BUFCLK and BUFCLKF signals to operate the read data output circuit 118 and the write data input circuit 120 at a double-data rate (DDR) and when in the second mode the data clock timing circuit 130 is configured to provide the IO clock signals and the BUFCLK and BUFCLKF signals to operate the read data output circuit 118 and the write data input circuit 120 at a quad-data rate (QDR). When operating at a DDR, two bits of data are output by the read data output circuit 118 or input by the write data input circuit 120 for each clock cycle of the write clock signal and the complementary write clock signal WCK_t, WCK_c. When operating at a QDR, four bits of data are output by the read data output circuit 118 or input by the write data input circuit 120 for each clock cycle of the write clock signal and the complementary write clock signal WCK_t, WCK_c. In such an example, the first mode of the data clock timing circuit 130 may be referred to as a DDR mode and the second mode may be referred to as a QDR mode. The modes of operation may be selected through the use of a mode register. As known, a mode register may be used to select various modes of operations, options, features, etc. To set the various modes of operations, options, features, etc., information is programmed into the mode register having the value corresponding to the desired mode of operations, options, features, etc.

The apparatus 100 may be used to receive memory commands (e.g., read commands, write commands) according to a command and address clock CK_t, CK_c domain and provide corresponding internal memory commands to activate IO circuits (e.g., read data output circuit 118, write data input circuit 120) that are operated according to a write clock WCK_t, WCK_c domain. The memory commands cross between the CK clock domain and the WCK clock domain by buffering the commands in the command buffers based on the CK clock signals and providing the memory commands from the command buffers to the IO circuits based on the WCK clock signals. As will be explained in more detail below, data may be input and output according to different frequencies (e.g., DDR or QDR).

In operation, command and address signals provided by the receiver circuits 102 and 104 are latched and decoded by the command decoder and latch circuit 110 according to the CACLK and CACLKF clock signals. The CACLK and CACLKF clock signals are provided by the receiver circuit 106.

Internal read commands RDCMD provided by the command decoder and latch circuit 110 to the read command buffer 114 are buffered responsive to the CACLK and CACLKF clock signals. The read commands are provided to the read data output circuit 118 responsive to the BUFCLK and BUFCLKF clock signals to activate the read data output circuit 118. The BUFCLK and BUFCLKF clock signals are provided by the data clock timing circuit 130. When activated, the read data output circuit 118 receives read data and provides the read data to an external terminal 122 responsive to the IO clock signals from the data clock timing circuit 130. As previously described, in an embodiment, read data may be received by the read data output circuit 118 in parallel and provided to the external terminal 122 serially. The data clock timing circuit 130 may provide IO clock signals to operate the read data output circuit 118 according to a first frequency (e.g., DDR mode) or a second frequency (e.g., QDR mode).

Internal write commands WRCMD provided by the command decoder and latch circuit 110 to the write command buffer 112 are buffered responsive to the CACLK and CACLKF clock signals. The write commands are provided to the write data input circuit 120 responsive to the BUFCLK and BUFCLKF clock signals to activate the write data input circuit 120. When activated, the write data input circuit 120 receives write data from the external terminal 122 and provides internal write data responsive to the IO clock signals from the data clock timing circuit 130. As previously described, in an embodiment, write data may be received by the write data input circuit 120 from the external terminal 122 serially and the internal write data provided in parallel. The IO clock signals provided by the data clock timing circuit 130 may be used to operate the write data input circuit 120 according to a first frequency (e.g., DDR mode) or a second frequency (e.g., QDR mode).

In the embodiment shown in FIG. 2, the data clock timing circuit 130 includes a phase-locked loop (PLL) circuit 132 that receives the four phase clock signals DCLK0, DCLK90, DCLK180, DCLK270 from the a clock divider circuit 124. The PLL circuit 132 provides four clock signals PLLCK0, PLLCK90, PLLCK180, PLLCK270 to a first input of the multiplexer 138 responsive to the DCLK0, DCLK90, DCLK180, DCLK270 clock signals. The PLLCK0, PLLCK90, PLLCK180, PLLCK270 clock signals have relative phases to each other (e.g., 0 degrees, 90 degrees, 180 degrees, and 270 degrees). The PLLCK0, PLLCK90, PLLCK180, PLLCK270 clock signals have a higher clock frequency than the clock frequency of the DCLK0, DCLK90, DCLK180, DCLK270 clock signals. For example, in an embodiment of the disclosure, the PLL circuit 132 provides the PLLCK0, PLLCK90, PLLCK180, PLLCK270 clock signals having a clock frequency that is twice that of the clock frequency of the DCLK0, DCLK90, DCLK180, DCLK270 clock signals. By way of a non-limiting example, the clock frequency of the DCLK0, DCLK90, DCLK180, DCLK270 clock signals may be 1.5 GHz and the clock frequency of the PLLCK0, PLLCK90, PLLCK180, PLLCK270 clock signals may be 3.0 GHz. The DCLK0, DCLK90, DCLK180, DCLK270 clock signals are also provided to a second input of the multiplexer 138. The multiplexer 138 provides either the PLLCK0, PLLCK90, PLLCK180, PLLCK270 clock signals or the DCLK0, DCLK90, DCLK180, DCLK270 clock signals as the IO clock signals based on a control signal MUXCTL.

Two of the four PLLCK clock signals are also provided to a clock divider circuit 134. For example, in an embodiment, the two PLLCK clock signals are PLLCK0 and PLLCK180, which are complementary. The clock divider circuit 134 provides four clock signals DIVCK0, DIVCK90, DIVCK180, DIV270 having relative phases to each other (e.g., 0 degrees, 90 degrees, 180 degrees, and 270 degrees). Two of the four DIVCK clock signals are provided back to the PLL circuit 132. For example, in an embodiment of the disclosure the DIVCK0 and DIVCK180 clock signals are provided. The two DIVCK clock signals may be used by the PLL circuit 132 to synchronize the PLLCK clock signals (and the DIVCK clock signals) with the DCLK clock signals. Two of the four DIVCK clock signals are provided to a first input of the multiplexer 136. For example, the DIVCK0 and DIVCK180 clock signals may be provided to the multiplexer 136 in an embodiment of the disclosure. A second input of the multiplexer 136 receives two of the four IO clock signals provided by the multiplexer 138. The multiplexer 136 provides the two DIVCK clock signals or the two IO clock signals as the buffer clock signals BUFCLK and BUFCLKF based on the control signal MUXCTL. The clock frequency of the DIVCK clock signals is lower than the clock frequency of the PLLCK clock signals. In an embodiment of the disclosure, the DIVCK clock signals have a clock frequency that is one-half of the clock frequency of the PLLCK clock signals.

In operation, in a first mode (e.g., DDR mode), the control signal MUXCTL has a first logic value (e.g., a high logic value) causing the multiplexer 138 to provide the DCLK0, DCLK90, DCLK180, DCLK270 clock signals as the IO clock signals, and further causing the multiplexer 136 to provide two of the four IO clock signals as the buffer clock signals BUFCLK and BUFCLKF. As a result, the clock frequency of the IO clock signals is the same as the clock frequency of the DCLK clock signals. As previously described, in an embodiment, the DCLK clock signals have a clock frequency that is one-half of the clock frequency of the WCK_t and WCK_c clock signals. Consequently, the IO clock signals have a clock frequency that is one-half of the clock frequency of the WCK_t and WCK_c clock signals. In a second mode (e.g., QDR mode), the control signal MUXCTL has a second logic value (e.g., a low logic value) causing the multiplexer 138 to provide the PLLCK clock signals as the IO clock signals, and further causing the multiplexer 136 to provide the two of the four DIVCK clock signals as the BUFCLK and BUFCLKF clock signals. As a result, the clock frequency of the IO clock signals is twice the clock frequency of the DCLK clock signals, and is the same clock frequency of the WCK_t and WCK_c clock signals.

As illustrated by the previous example, in a DDR mode the data clock timing circuit 130 provides four phase IO clock signals having a clock frequency that is one-half of the clock frequency of the WCK_t and WCK clock signals to operate the read data output circuit 118 and the write data input circuit 120 at a double-data rate. In a QDR mode the data clock timing circuit 130 provides four phase IO clock signals having a clock frequency that is the same as the clock frequency of the WCK_t and WCK clock signals to operate the read data output circuit 118 and the write data input circuit 120 at a quad-data rate.

The data clock timing circuit 130 has been described as including a PLL circuit 132 that receives the four phase clock signals DCLK0, DCLK90, DCLK180, DCLK270 and provides the four phase clock signals PLLCK0, PLLCK90, PLLCK180, and PLLCK270. In an alternative embodiment, the data clock timing circuit 130 includes a clock circuit other than a PLL circuit. The clock circuit would receive the four phase clock signals DCLK0, DCLK90, DCLK180, DCLK270 and provide the four phase clock signals PLLCK0, PLLCK90, PLLCK180, and PLLCK270. As previously described, the four phase PLLCK clock signals have a clock frequency that is twice the clock frequency of the four phase DCLK clock signals. More generally, the data clock timing circuit 130 may include alternative clock circuits, other than the PLL circuit 132, that provide the four phase PLLCK clock signals responsive to the four phase DCLK clock signals as previously described without departing from the scope of the disclosure.

Figure 3:
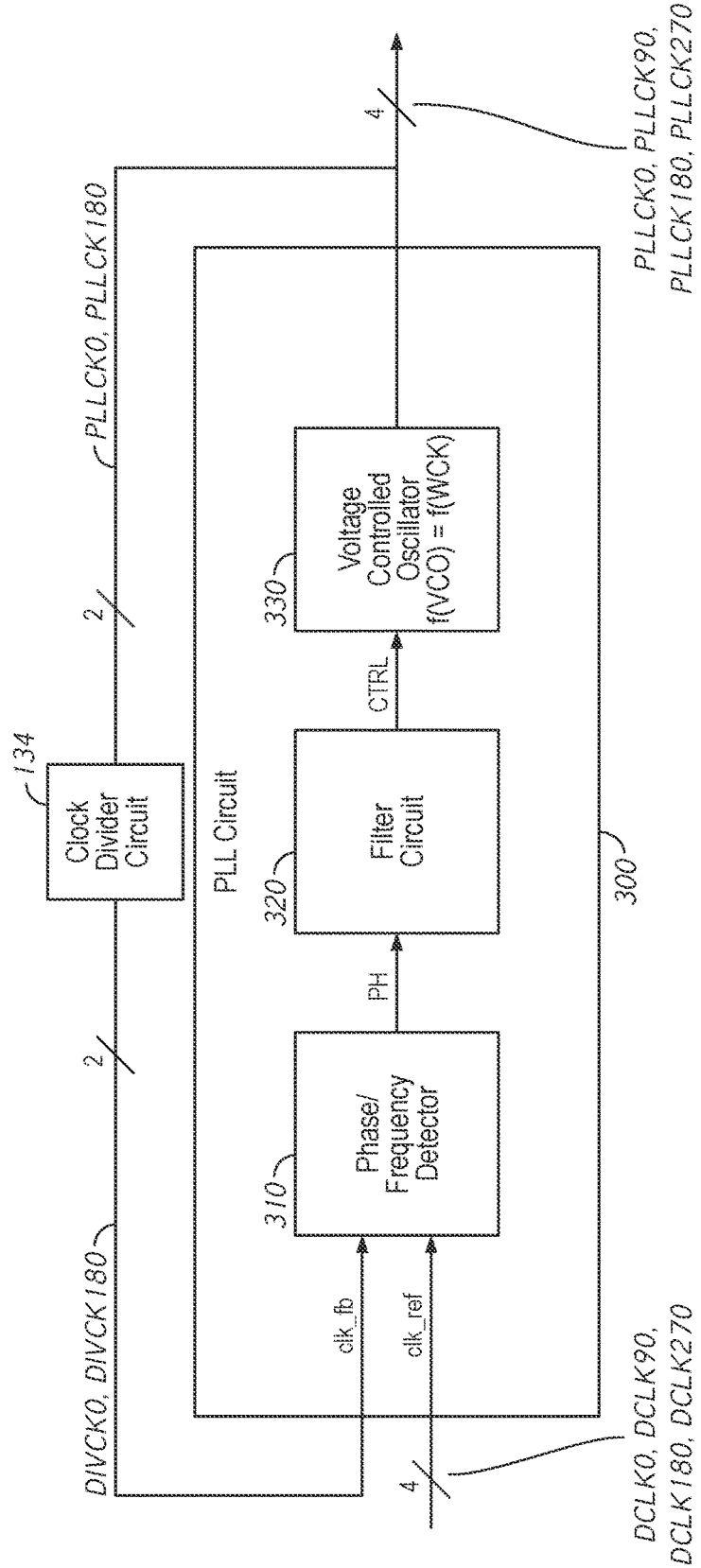
FIG. 3 is a block diagram of a phase-locked loop (PLL) circuit according to an embodiment of the disclosure.

FIG. 3 is a block diagram of a PLL circuit 300 according to an embodiment of the disclosure. The PLL circuit 300 may be used as the PLL circuit 132 of FIG. 2. The PLL circuit 300 includes a phase/frequency detector 310 that receives four phase clock signals as reference clock signals clk_ref, for example, the DCLK0, DCLK90, DCLK180, and DCLK270 clock signals provided by the clock divider circuit 124 (FIG. 2). The phase/frequency detector 310 further receives complementary clock signals as feedback clock signals clk_fb, for example, the DIVCK0 and DIVCK180 clock signals provided by the clock divider circuit 134. The phase/frequency detector 310 compares the phases and frequencies of the reference clock signals and the feedback clock signals and provides a PH signal that is indicative of a phase and frequency difference between the reference and feedback clock signals.

A filter circuit 320 receives the PH signal and provides a control signal CTRL. The CTRL signal provided by the filter circuit 320 is based on the PH signal. For example, in an embodiment, a voltage of the CTRL signal is based on the PH signal. The filter circuit 320 may filter the PH signal in providing the CTRL signal to provide stability to the phase loop and limit ripples that may be present in the PH signal when providing the CTRL signal.

A voltage controlled oscillator (VCO) 330 receives the CTRL signal and provides four clock signals having relative phases to each other (i.e., provides four phase clock signals) that have a clock frequency that is greater than the clock frequency of the complementary reference clock signals. In an embodiment, the clock frequency of the four phase clock signals is twice the clock frequency of the complementary reference clock signals. By way of a non-limiting example, the clock frequency of the DCLK clock signals may be 1.5 GHz and the clock frequency of the PLLCK clock signals may be 3.0 GHz. The clock signals may be used as the PLLCK0, PLLCK90, PLLCK180, PLLCK270 previously described with reference to FIG. 2. The VCO 330 provides the four clock signals having a phase and frequency that is based on the CTRL signal. For example, the four clock signals may have a phase and frequency based on a voltage of the CTRL signal. When the voltage of the CTRL signal changes, for example, in response to a change in the PH signal from the phase/frequency detector 310, the phase and frequency of the four clock signals may change accordingly.

The clock divider circuit 134 receives two of the four clock signals provided by the VCO 330. In the embodiment of FIG. 3, complementary clock signals are received from the VCO 330 (e.g., PLLCK0 and PLLCK180). The clock divider circuit 134 divides the clock frequency of the complementary clock signals to provide lower clock frequency complementary clock signals (e.g., DIVCK0 and DIVCK180). For example, in an embodiment, the clock divider circuit 134 provides the lower clock frequency complementary clock signals having a clock frequency that is one-half of the clock frequency of the PLLCK clock signals from the VCO 330. The lower clock frequency complementary clock signals are provided as the feedback clock signals to the phase/frequency detector 310.

In operation, the phase/frequency detector 310 compares the phase and frequency of the reference clock signals (e.g., DCLK0, DCLK90, DCLK180, and DCLK270) and the feedback clock signals (e.g., DIVCK0 and DIVCK180) and provides a PH signal to the filter circuit 320 to adjust the VCO 330 until the phase and frequency of the feedback clock signals matches the phase and frequency of the reference clock signals. When the phases and frequencies match, the PLL 300 is said to be "locked." The resulting four phase clock signals provided by the PLL 300 are in phase with the reference clock signals and have a clock frequency that is greater than the clock frequency of the reference clock signals (e.g., twice the clock frequency of the reference clock signals).

Figure 4:
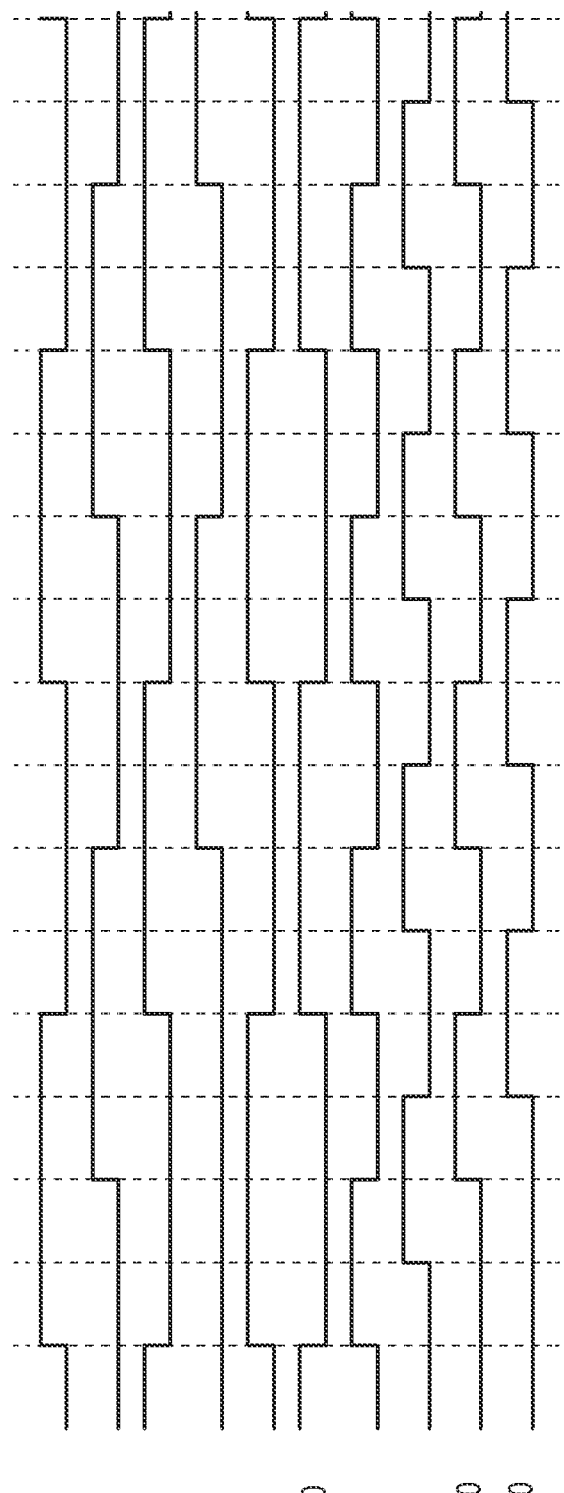
FIG. 4 is a timing diagram of various signals during operation of the PLL circuit of FIG. 3 according to an embodiment of the disclosure.

FIG. 4 is a timing diagram of various signals during operation of the PLL circuit 300 according to an embodiment of the disclosure. The various signals illustrated by FIG. 4 are from when the PLL circuit 300 is locked. FIG. 4 illustrates the DCLK0, DCLK90, DCLK180, and DCLK270 which may be provided as the reference clock signals to the PLL circuit 300. The DCLK0 and DCLK180 signals are complementary. FIG. 4 further illustrates the DIVCK0 and DIVCK180 signals provided as the feedback clock signals. The DIVCK0 and DIVCK180 clock signals are also complementary. The locked condition of the PLL 300 is reflected by the DCLK0 clock signal having the same phase and frequency as the DIVCK0 clock signal, and the DCLK180 clock signal having the same phase and frequency as the DIVCK180 clock signal. As previously described, when the PLL 300 is locked, the four phase clock signals provided by the VCO 330 (e.g., PLLCK0, PLLCK90, PLLCK180, PLLCK270) are in phase with the reference clock signals and have a clock frequency that is greater than the clock frequency of the reference clock signals. As illustrated in FIG. 4, clock edges of the PLLCK0, PLLCK90, PLLCK180, PLLCK270 clock signals are aligned with the clock edges of the DCLK0, DCLK180 clock signals, and have a clock frequency that is twice the clock frequency of the DCLK0, DCLK180 clock signals. The PLLCK0, PLLCK90, PLLCK180, PLLCK270 clock signals have relative phases to each other as well (e.g., 0 degrees, 90 degrees, 180 degrees, and 270 degrees). As previously described, the PLLCK clock signals having twice the frequency of the DCLK clock signals (and the same frequency as the WCK clock signals) may be used to operate the read data output circuit 118 and the write data input circuit 120 at a higher frequency, for example, at a QDR.

FIG. 5 is block diagram of an apparatus 500 according to an embodiment of the disclosure. The apparatus 500 includes elements previously described with reference to the apparatus 100 of FIG. 2. Common elements are referenced in FIG. 5 using the same reference numbers and reference names as used in FIG. 2. Generally, the apparatus 500 is different from the apparatus 100 of FIG. 2 with regards to the clock divider circuit. In particular, the clock divider circuit 530 of the apparatus 500 is different than the clock divider circuit 130 of the apparatus 100. While the clock divider circuit 530 provides BUFCLK clock signals and IO signals responsive to DCLK clock signals, as does the clock divider circuit 130, the clock divider circuit 530 is structured differently from the clock divider circuit 130.

The clock divider circuit 530 includes a phase-locked loop (PLL) circuit 532 that receives the four phase clock signals DCLK0, DCLK90, DCLK180, DCLK270 from the a clock divider circuit 124. The PLL circuit 132 provides eight clock signals PLLCK0, PLLCK45, PLLCK90, PLLCK135, PLLCK180, PLLCK225, PLLCK270, and PLLCK315 having relative phases to each other responsive to the DCLK0, DCLK90, DCLK180, DCLK270 clock signals. For example, PLLCK clock signals may be phase shifted relative to each other by 45 degrees, such as 0 degrees, 45 degrees, 90 degrees, 135 degrees, 180 degrees, 225 degrees, 270 degrees, and 315 degrees. The eight clock signals may have the same clock frequency as the clock frequency of the DCLK0, DCLK90, DCLK180, DCLK270 clock signals. By way of a non-limiting example, the clock frequency of the DCLK clock signals may be 1.5 GHz and the clock frequency of the PLLCK clock signals may be 1.5 GHz.

The eight PLLCK clock signals are provided to a logic circuit 535. The logic circuit 535 provides four clock signals XORCK0, XORCK90, XORCK180, XOR270 to a first input of the multiplexer 138 responsive to the PLLCK clock signals. In an embodiment, the logic circuit 535 is an exclusive OR (XOR) logic circuit. The XORCK0, XORCK90, XORCKK180, XOR270 clock signals have relative phases to each other (e.g., 0 degrees, 90 degrees, 180 degrees, and 270 degrees). The XORCK0, XORCK90, XORCK180, XOR270 clock signals have a higher clock frequency than the clock frequency of the eight PLLCK clock signals. For example, in an embodiment of the disclosure, the logic circuit 535 provides the XORCK clock signals having a clock frequency that is twice that of the clock frequency of the eight PLLCK clock signals. By way of a non-limiting example, the clock frequency of the PLLCK clock signals may be 1.5 GHz and the clock frequency of the XORCK clock signals may be 3.0 GHz.

The DCLK0, DCLK90, DCLK180, DCLK270 clock signals from the clock divider circuit 124 are also provided to a second input of the multiplexer 138. The multiplexer 138 provides either the XORCK0, XORCK90, XORCK180, XOR270 clock signals or the DCLK0, DCLK90, DCLK180, DCLK270 clock signals as the IO clock signals based on a control signal MUXCTL.

Two of the eight PLLCK clock signals are provided back to the PLL circuit 532. For example, in an embodiment, the PLLCK0 and PLLCK180 clock signals may be provided to the PLL circuit 532. The PLLCK0 and PLLCK180 clock signals are complementary clock signals. The two PLLCK clock signals may be used by the PLL circuit 532 to synchronize the PLLCK clock signals with the DCLK clock signals. The two PLLCK clock signals are also provided to a first input of the multiplexer 536. A second input of the multiplexer 536 receives two of the four IO clock signals provided by the multiplexer 538. The multiplexer 536 provides the two PLLCK clock signals or the two IO clock signals as the buffer clock signals BUFCLK and BUFCLKF based on the control signal MUXCTL.

In operation, in a first mode (e.g., DDR mode), the control signal MUXCTL has a first logic value (e.g., a high logic level) causing the multiplexer 538 to provide the DCLK0, DCLK90, DCLK180, DCLK270 clock signals as the IO clock signals, and further causing the multiplexer 536 to provide the two of the four IO clock signals as the buffer clock signals BUFCLK and BUFCLKF. As a result, the clock frequency of the IO clock signals is the same as the clock frequency of the DCLK clock signals (e.g., 1.5 GHz). As previously described, in an embodiment, the DCLK clock signals have a clock frequency that is one-half of the clock frequency of the WCK_t and WCK_c clock signals. Consequently, the IO clock signals have a clock frequency that is one-half of the clock frequency of the WCK_t and WCK_c clock signals. In a second mode (e.g., QDR mode), the control signal MUXCTL has a low logic value causing the multiplexer 538 to provide the XORCK clock signals as the IO clock signals, and further causing the multiplexer 536 to provide the two PLLCK clock signals (e.g., PLLCK0 and PLLCK180) as the BUFCLK and BUFCLKF clock signals. As a result, the clock frequency of the IO clock signals is twice the clock frequency of the DCLK clock signals, and is the same clock frequency of the WCK_t and WCK_c clock signals.

As illustrated by the previous example, in a DDR mode the data clock timing circuit 530 provides four phase IO clock signals having a clock frequency that is one-half of the clock frequency of the WCK_t and WCK_c clock signals to operate the read data output circuit 118 and the write data input circuit 120 at a double-data rate. In a QDR mode the data clock timing circuit 530 provides four phase IO clock signals having a clock frequency that is the same as the clock frequency of the WCK_t and WCK_c clock signals to operate the read data output circuit 118 and the write data input circuit 120 at a quad-data rate.

The data clock timing circuit 530 has been described as including a PLL circuit 532 that receives the four phase clock signals DCLK0, DCLK90, DCLK180, DCLK270 and provides the eight phase clock signals PLLCK0, PLLCK45, PLLCK90, PLLCK135, PLLCK180, PLLCK225, PLLCK270, and PLLCK315. In an alternative embodiment, the data clock timing circuit 530 includes a delay-locked loop (DLL) circuit instead of a PLL circuit. The DLL circuit would receive the four phase clock signals DCLK0, DCLK90, DCLK180, DCLK270 and provide the eight phase clock signals PLLCK0, PLLCK45, PLLCK90, PLLCK135, PLLCK180, PLLCK225, PLLCK270, and PLLCK315. As previously described, the eight phase PLLCK clock signals have a clock frequency that is the same as the clock frequency as the four phase DCLK clock signals. More generally, the data clock timing circuit 530 may include a clock circuit that provides the eight phase PLLCK clock signals responsive to the four phase DCLK clock signals as previously described without departing from the scope of the disclosure.

Figure 6:
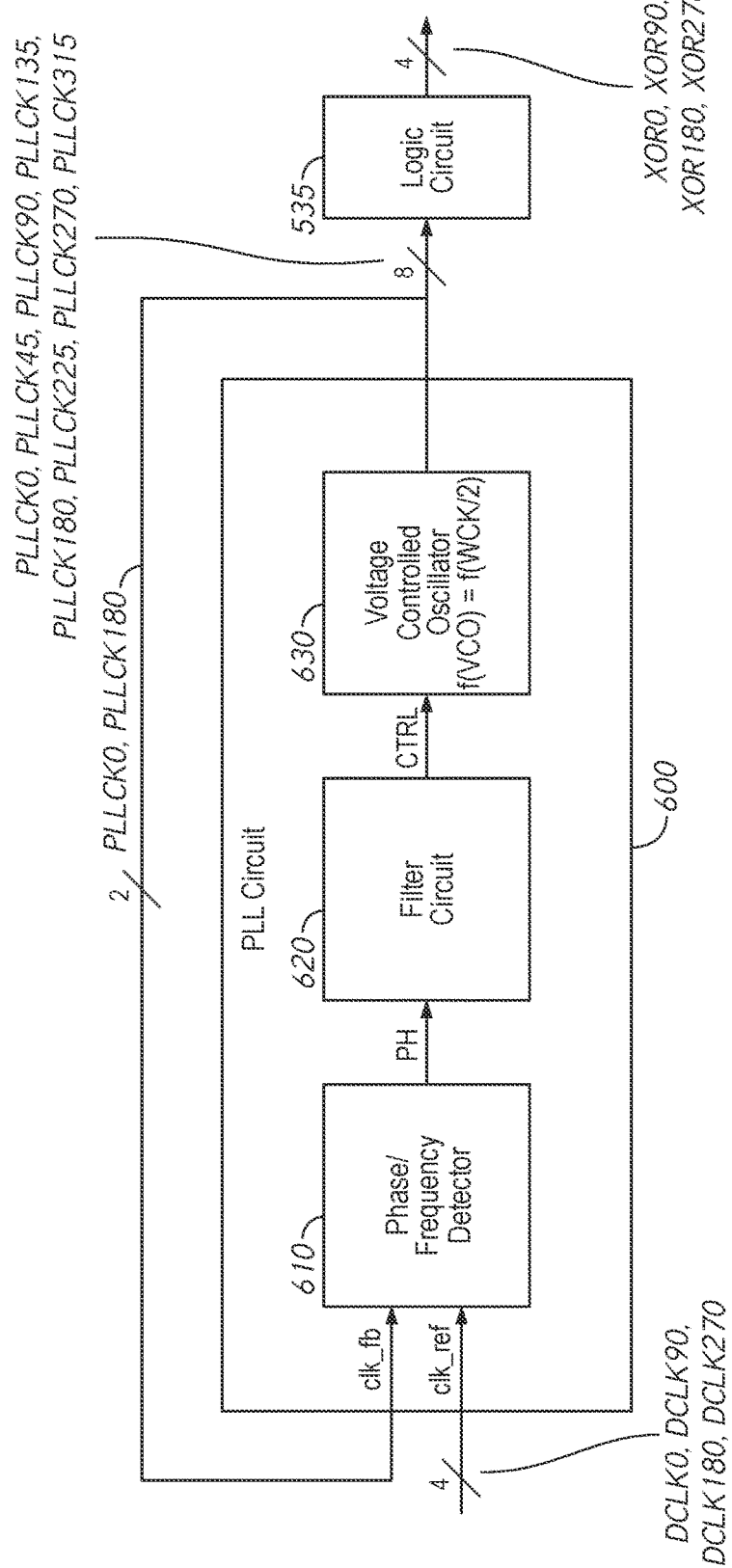
FIG. 6 is a block diagram of a PLL circuit according to an embodiment of the disclosure.

FIG. 6 is a block diagram of a PLL circuit 600 according to an embodiment of the disclosure. The PLL circuit 600 may be used as the PLL circuit 532 of FIG. 5. The PLL circuit 600 includes a phase/frequency detector 610 that receives four phase clock signals as reference clock signals clk_ref, for example, the DCLK0, DCLK90, DCLK180, and DCLK270 clock signals provided by the clock divider circuit 124 (FIG. 5). The phase/frequency detector 610 further receives complementary clock signals as feedback clock signals clk_fb, for example, the PLLCK0 and PLLCK 180 clock signals provided by the PLL circuit 600. The phase/frequency detector 610 compares the phases and frequencies of the reference clock signals clk_ref and the feedback clock signals clk_fb and provides a PH signal that is indicative of a phase and frequency difference between the reference and feedback clock signals.

A filter circuit 620 receives the PH signal and provides a control signal CTRL. The CTRL signal provided by the filter circuit E20 is based on the PH signal. For example, in an embodiment, a voltage of the CTRL signal is based on the PH signal. The filter circuit E20 may filter the PH signal in providing the CTRL signal to provide stability to the phase loop and limit ripples that may be present in the PH signal when providing the CTRL signal.

A voltage controlled oscillator (VCO) 630 receives the CTRL signal and provides eight clock signals having relative phases to each other (i.e., provides eight phase clock signals) that have a clock frequency that is the same as the clock frequency of the complementary reference clock signals clk_ref By way of a non-limiting example, the clock frequency of the DCLK clock signals may be 1.5 GHz and the clock frequency of the PLLCK clock signals may be 1.5 GHz. The clock signals may be used as the PLLCK0, PLLCK45, PLLCK90, PLLCK135, PLLCK180, PLLCK225, PLLCK270, and PLLCK315 clock signals previously described with reference to FIG. 5. The VCO 630 provides the eight clock signals having a phase and frequency that is based on the CTRL signal. For example, the eight clock signals may have a phase and frequency based on a voltage of the CTRL signal. When the voltage of the CTRL signal changes, for example, in response to a change in the PH signal from the phase/frequency detector 610, the phase and frequency of the eight clock signals may change accordingly.

The logic circuit 535 receives the eight phase clock signals provided by the VCO 630. The logic circuit 535 provides four clock signals XORCK0, XORCK90, XORCK180, XOR270 based on logic operations on the eight PLLCK clock signals. In an embodiment, the logic circuit 535 is an XOR logic circuit, and the logic operations may be as follows: XORCK0=PLLCK0 xor PLLCK90; XORCK90=PLLCK45 xor PLLCK135; XOR180=PLLCK90 xor PLLCK180; and XOR270=PLLCK270 xor PLLCK225. The XORCK0, XORCK90, XORCK180, XOR270 clock signals have relative phases to each other (e.g., 0 degrees, 90 degrees, 180 degrees, and 270 degrees). The XORCK0, XORCK90, XORCK180, XOR270 clock signals have a higher clock frequency than the clock frequency of the eight PLLCK clock signals. For example, in an embodiment of the disclosure, the logic circuit 535 provides the XORCK clock signals having a clock frequency that is twice that of the clock frequency of the eight PLLCK clock signals. By way of a non-limiting example, the clock frequency of the PLLCK clock signals may be 1.5 GHz and the clock frequency of the XORCK clock signals may be 3.0 GHz.

In operation, the phase/frequency detector 610 compares the phase and frequency of the reference clock signals (e.g., DCLK0, DCLK90, DCLK180, and DCLK270) and the feedback clock signals (e.g., PLLCK0 and PLLCK180) and provides a PH signal to the filter circuit E20 to adjust the VCO 630 until the phase and frequency of the feedback clock signals clk_fb matches the phase and frequency of the reference clock signals clk_ref. When the phases and frequencies match, the PLL 600 is said to be "locked." The resulting eight phase clock signals provided by the PLL 600 are in phase with the reference clock signals clk_ref. The logic circuit 535 logically operates on the eight phase clock signals and provides the four XORCK clock signals that are in phase with the DCLK0 and DCLK180 clock signals and have a clock frequency that is greater than the clock frequency of the DCLK0 and DCLK180 reference clock signals (e.g., twice the clock frequency).

Figure 7:
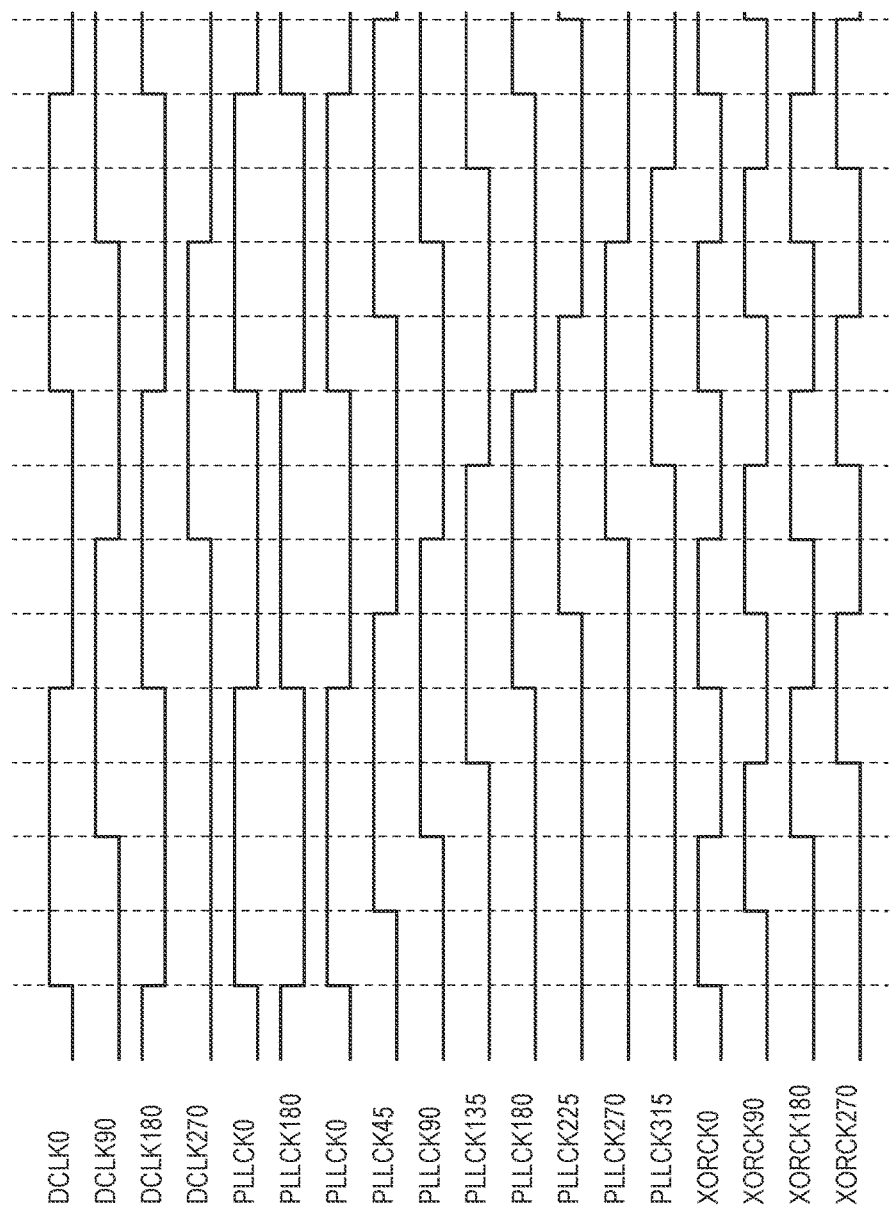
FIG. 7 is a timing diagram of various signals during operation of the PLL circuit of FIG. 6 according to an embodiment of the disclosure.

FIG. 7 is a timing diagram of various signals during operation of the PLL circuit 600 according to an embodiment of the disclosure. The various signals illustrated by FIG. 7 are provided by the logic circuit B25 when the PLL circuit 600 is locked. FIG. 7 illustrates the DCLK0, DCLK90, DCLK180, and DCLK270 clock signals which may be provided as the reference clock signals clk_ref to the PLL circuit 600. The DCLK0 and DCLK180 signals are complementary. FIG. 7 further illustrates the PLLCK0 and PLLCK180 clock signals provided as the feedback clock signals clk_fb. The PLLCK0 and PLLCK180 clock signals are also complementary. The locked condition of the PLL 600 is reflected by the DCLK0 clock signal having the same phase and frequency as the PLLCK0 clock signal, and the DCLK180 clock signal having the same phase and frequency as the PLLCK180 clock signal. As previously described, when the PLL 600 is locked, the eight phase clock signals (e.g., PLLCK0, PLLCK45, PLLCK90, PLLCK135, PLLCK180, PLLCK225, PLLCK270, PLLCK315) provided by the VCO 630 are in phase with the reference clock signals clk_ref and have a clock frequency that is the same clock frequency of the reference clock signals. As illustrated in FIG. 7, clock edges of the PLLCK0, PLLCK45, PLLCK90, PLLCK135, PLLCK180, PLLCK225, PLLCK270, and PLLCK315 clock signals are aligned with the clock edges of the DCLK0, DCLK180 clock signals, and have a clock frequency that is the same as the clock frequency of the DCLK0, DCLK180 clock signals.

The PLLCK0, PLLCK45, PLLCK90, PLLCK135, PLLCK180, PLLCK225, PLLCK270, and PLLCK315 clock signals have relative phases to each other as well (e.g., 0 degrees, 45 degrees, 90 degrees, 135 degrees, 180 degrees, 215 degrees, 270, and 315 degrees). The PLLCK clock signals are provided to the logic circuit 535 to provide the four XORCK clock signals based on logic operations on the eight PLLCK clock signals. FIG. 7 illustrates the XORCK clock signals resulting from an XOR logic operation. For example, XORCK0=PLLCK0 xor PLLCK90; XORCK90=PLLCK45 xor PLLCK135; XOR180=PLLCK90 xor PLLCK180; and XOR270=PLLCK270 xor PLLCK225. The XORCK0, XORCK90, XORCK180, XORCK270 clock signals have twice the clock frequency of the eight PLLCK clock signals (and the same frequency as the WCK clock signals) and may be used to operate the read data output circuit 118 and the write data input circuit 120 at a higher frequency, for example, at a QDR mode.

Figure 8A:
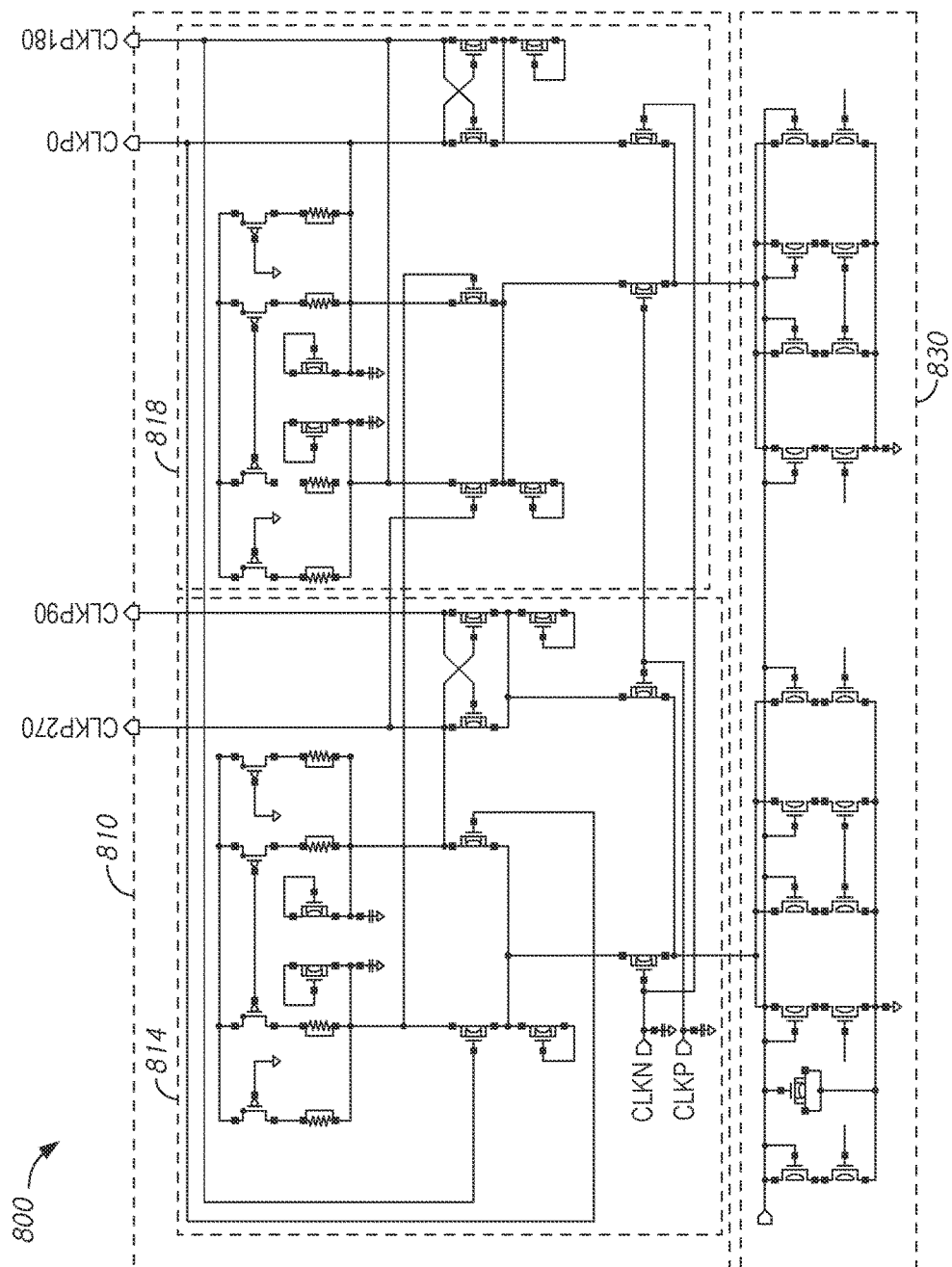
FIG. 8A is a schematic diagram of a clock divider circuit according to an embodiment of the disclosure.

FIG. 8A is a schematic diagram of a clock divider circuit 800 according to an embodiment of the disclosure. The clock divider circuit 800 includes a four phase clock divider circuit 810 that receives complementary input clock signals CLKP and CLKN and provides four clock signals CLKP0, CLKP90, CLKP180, and CLKP270. The four CLKP clock signals have relative phases to each other (i.e., four phase clock signals). For example, the CLKP0 clock signal is 0 degrees, the CLKP90 clock signal is 90 degrees out of phase from the CLKP0 clock signal, the CLKP180 clock signal is 180 degrees out of phase from the CLKP0 clock signal, and the CLKP270 is 270 degrees out of phase from the CLKP0 clock signal. The four phase CLKP clock signals have a clock frequency that is lower than the clock frequency of the CLKP and CLKN clock signals. For example, in an embodiment, the CLKP0, CLKP90, CLKP180, and CLKP270 clock signals have a clock frequency that is one-half of the clock frequency of the CLKP and CLKN clock signals.

The clock divider circuit 800 may be used for the clock divider circuit 124 and the clock divider circuit 134 in an embodiment. The CLKP and CLKN clock signals may be the DCLK and DCLKF clock signals and the four CLKP signals may be the DCLK0, DCLK90, DCLK180, and DCLK270 clock signals when the clock divider circuit 800 is used for the clock divider circuit 124. The CLKP and CLKN clock signals may be two PLLCK clock signals and the four CLKP signals may be the DIVCK0, DIVCK90, DIVCK180, and DIVCK270 clock signals when the clock divider circuit 800 is used for the clock divider circuit 134.

The phase clock divider circuit 810 includes clock divider stages 814 and 818. Each of the clock divider stages 814 and 818 receives the CLKP and CLKN signals, and provides two of the four phase clock signals. The clock divider stage 814 provides the CLKP90 and CLKP270 clock signals and the clock divider stage 818 provides the CLKP0 and CLKP180 clock signals. The clock divider circuit 800 further includes a bias circuit 830 that provides bias currents to the phase clock divider circuit 810. The bias currents provided by the bias circuit 830 bias the four phase clock divider circuit 810 for operation.

Figure 8B:
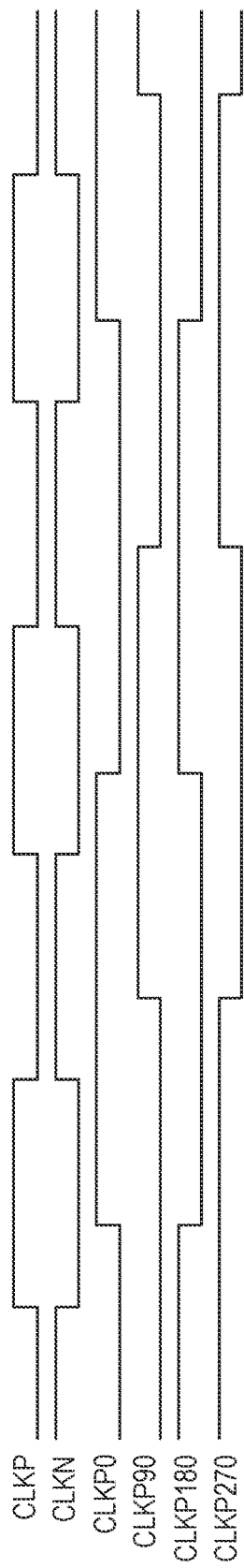
FIG. 8B is a timing diagram showing various clock signals during operation of the clock divider circuit of FIG. 8A according to an embodiment of the disclosure.

In operation, the CLKP and CLKN clock signals control coupling of the bias current from the bias circuit 830 to the clock divider stages 814 and 818. As the CLKP and CLKN clock signals control the coupling of the bias current, the clock divider stage 814 provides the CLKP90 and CLKP270 clock signals and the clock divider stage 818 provides the CLKP0 and CLKP180 clock signals. FIG. 8B is a timing diagram showing various clock signals during operation of the clock divider circuit 800 according to an embodiment of the disclosure. The CLKP and CLKN clock signals are shown as complementary clock signals. The CLKP0, CLKP90, CLK180, and CLK270 have a relative 90 degree phase relationship with each other, as shown by rising clock edges of the four phase CLKP clock signals being 90 degrees out of phase (and falling clock edges of the four phase CLKP clock signals being 90 degrees out of phase). The CLKP0, CLKP90, CLKP180, and CLKP270 clock signals have a clock frequency that is one-half of the clock frequency of the CLKP and CLKN clock signals.

FIG. 9A is a block diagram of a read data output circuit 900 according to an embodiment of the disclosure. The read data output circuit 900 is provided with four phase clock signals. The four clock signals pllclk_0, pllclk_90, pllclk_180, pllclk_270 may have a relative 90 degree phase relationship with each other. For example, the pllclk_0 may be 0 degrees, pllclk_90 may be 90 degrees, pllclk_180 may be 180 degrees, and pllclk_270 may be 270 degrees. The read data output circuit 900 may be used for the read data output circuit 118 in an embodiment. In such an embodiment, the pllclk_0, pllclk_90, pllclk_180, and pllclk_270 clock signals provided to the read data output circuit 900 may be the four phase clock signals IO0, IO90, IO180, and IO270.

The read data output circuit 900 includes a shift register 910 and a shift register 920. The shift register 910 receives a first clock signal pllclk_i or pllclk_j and the shift register 920 receives a second clock signal pllclk_(i+90) or pllclk_(j+90) that has a phase 90 degrees relative to the first clock signal (i=0, j=180). For example, the shift register 910 may receive the pllclk_0 clock signal and the shift register 920 may receive the pllclk_90 clock signal. Alternatively, the shift register 910 may receive the pllclk_180 clock signal and the shift register 920 may receive the pllclk_270 clock signal. Each shift register is configured to load bits of data in parallel and provide the bits of data serially responsive to the respective pllclk clock signal. In an embodiment, eight bits of data are provided to the shift register 910 and eight bits of data are provided to the shift register 920. In such embodiments, the read data output circuit 900 receives 16 bits of data in parallel and provides the 16 bits of data serially responsive to the pllclk clock signals (eight bits from shift register 910 and eight bits from shift register 920). Four bits of data are provided per clock cycle of the pllclk clock signals, with all 16 bits of data provided over four clock cycles of the pllclk clock signals. The read data output circuit 900 further includes a multiplexer 940 that provides the output of the shift register 910 or the shift register 920 based on a control signal provided by the XOR logic circuit 930. The XOR logic circuit 930 receives the first and second clock signals (e.g., pllclk0 and pllclk90; or pllclk180 and pllclk270) and performs and exclusive-OR operation on the clock signals to provide the control signal to the multiplexer 940.

In operation, the bits of data are loaded into the shift registers 910 and 920 in parallel and shifted out of the shift registers 910 and 920 serially responsive to the respective pllclk clock signal. The XOR logic circuit 930 provides a control signal that switches between high and low logic levels at a frequency that is twice as fast as the clock frequency of the pllclk clock signals. As a result, the multiplexer 940 is controlled to switch back and forth between the shift registers 910 and 920 to serially provide four bits of data every clock cycle of the pllclk clock signals.

With reference to FIGS. 2 and 5, when the IO clock signals have a clock frequency that is one-half the clock frequency of the WCK clock signals (e.g., the data clock timing circuit 130 and 530 are in a DDR mode), two bits of data are provided by the read data output circuit 900 per clock period of the WCK clock signal. When the IO clock signals have a clock frequency that is the same clock frequency as the WCK clock signals (e.g., the data clock timing circuit 130 and 530 are in a QDR mode), four bits of data are provided by the read data output circuit 900 per clock period of the WCK clock signal.

FIG. 9B is a block diagram of a shift register 950 according to an embodiment of the disclosure. The shift register 950 may be used as the shift register 910 and 920 in an embodiment. The shift register 950 includes a shift register 952 and a shift register 954. The shift registers 952 and 954 each receive bits of data in parallel and provide the bits of data serially responsive to a respective pllclk clock signal. For example, in an embodiment, the shift register 952 receives four bits of data in parallel and provides the four bits of data serially responsive to the pllclk_i clock signal, and the shift register 954 receives four bits of data in parallel and provides the four bits of data serially responsive to the pllclk_(i+180) clock signal. The shift register 952 may receive the pllclk_i clock signal, where i may be 0 or 90, and the shift register 954 may receive the pllclk_(i+180) clock signal. For example, where the shift register 952 receives the pllclk_0 clock signal, the shift register 954 receives the pllclk_180 clock signal; where the shift register 952 receives the pllclk_90 clock signal, the shift register 954 receives the pllclk_270 clock signal. A multiplexer 956 provides data bits from either the shift register 952 or the shift register 954 as controlled by the pllclk clock signal provided to the shift register 954 (i.e., pllclk_(i+180)).

In operation, the shift register 950 receives bits of data in parallel and serially provides the bits of data according the pllclk_i and pllclk_(i+180) clock signals. The pllclk clock signal controls the multiplexer 956 to alternately provide bits of data from the shift registers 952 and 954 as the bits of data are shifted through the shift registers 952 and 954. As a result, the shift register 950 provides two bits of data per clock cycle of the pllclk clock signal.

FIG. 9C is a block diagram of a shift register 960 according to an embodiment of the disclosure. The shift register 960 may be used as the shift registers 952 and 954. The shift register 960 receives bits of data in parallel and provides the bits of data serially responsive to the pllclk_i clock signal. The shift register 960 includes five D-flip flops (DFF) 970(0)-970(4) and four multiplexers 972(0)-972(3). Each multiplexer is controlled by a load register control signal to provide either a respective bit of data or an output of a respective DFF 970. Each of the DFFs 970(0)-970(4) provides an output based on an input responsive to the pllclk_i clock signal (wherein i may be 0, 90, 180, or 270).

In operation, the multiplexers 972 provide a respective data bit to a corresponding DFF 970 when the load register control signal has a first logic value (e.g., high logic level). For example, when the load register control signal is a high logic level, the multiplexer 972(0) provides bit<0> to the DFF 970(0), the multiplexer 972(1) provides bit<1> to the DFF 970(1), the multiplexer 972(2) provides bit<2> to the DFF 970(2), and the multiplexer 972(3) provides bit<3> to the DFF 970(3). The value of the bit of data from a respective multiplexer 972 is output by the DFFs 970 when the pllclk clock signal changes to a high clock level. The load register control signal is changed to a second logic level (e.g., a low logic level) and the multiplexers 970 provide the output from a previous DFF 970. As the pllclk clock signal changes between the high clock level and a low clock level, the bits of data are shifted through the DFFs 970 to provide the bits of data serially. One bit of data is provided per clock cycle of the pllclk clock signal.

After the last bit of data is provided, new respective bits of data may be loaded by changing the load register control signal to the first logic level. The DFFs 970 may be reset to provide an output of a known logic value by changing a hold pattern signal provided to the DFF 970(4) to the desired logic value and clocking the pllclk clock signal to shift the logic value through the DFF 970(3), the DFF 970(2), the DFF 970(1), and then the DFF 970(0).

FIG. 9D is a timing diagram illustrating the timing of the output of the bits of data by the shift register 900, the shift register 950, and the shift register 960 relative to one another. Generally, the shift register 900 provides four bits of data per clock cycle of the pllclk signal, the shift register 950 provides two bits of data per clock cycle of the pllclk signal, and the shift register 960 provides one bit of data per clock cycle of the pllclk signal.

Figure 10:
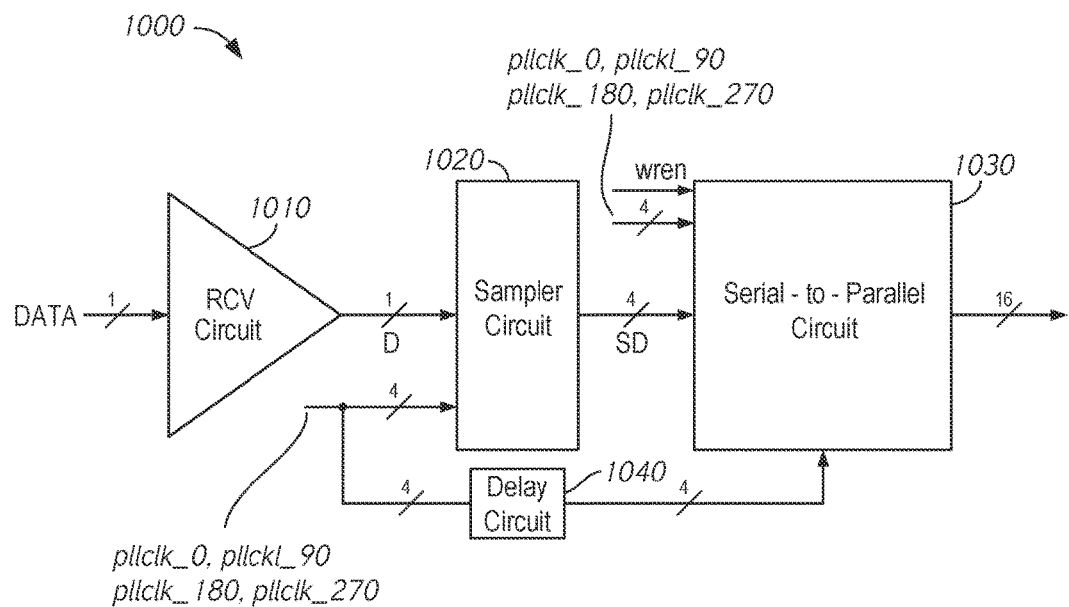
FIG. 10 is a block diagram of a write data input circuit according to an embodiment of the disclosure.

FIG. 10 is a block diagram of a write data input circuit 1000 according to an embodiment of the disclosure. The write data input circuit 1000 includes a receiver circuit 1010 configured to receive bits of data serially (i.e., consecutive single bits) and serially provide internal data D to a sampler circuit 1020. The sampler circuit 1020 further receives four clock signals pllclk_0, pllclk_90, pllclk_180, pllclk_270. The four clock signals pllclk have a relative 90 degree phase relationship with each other. For example, the pllclk_0 may be 0 degrees, pllclk_90 may be 90 degrees, pllclk_180 may be 180 degrees, and pllclk_270 may be 270 degrees. The write data input circuit 1000 may be used for the write data input circuit 120 in an embodiment. In such an embodiment, the pllclk_0, pllclk_90, pllclk_180, and pllclk_270 clock signals provided to the write data input circuit 1000 may be the four phase clock signals IO0, IO90, IO180, and IO270. The sampler circuit 1020 samples the serially provided internal data D and provides sampled data SD responsive to the four pllclk clock signals. The sampler circuit 1020 samples one bit of the internal data D every rising edge of each of the four pllclk clock signals and provides four bits in parallel.

Figure 11:
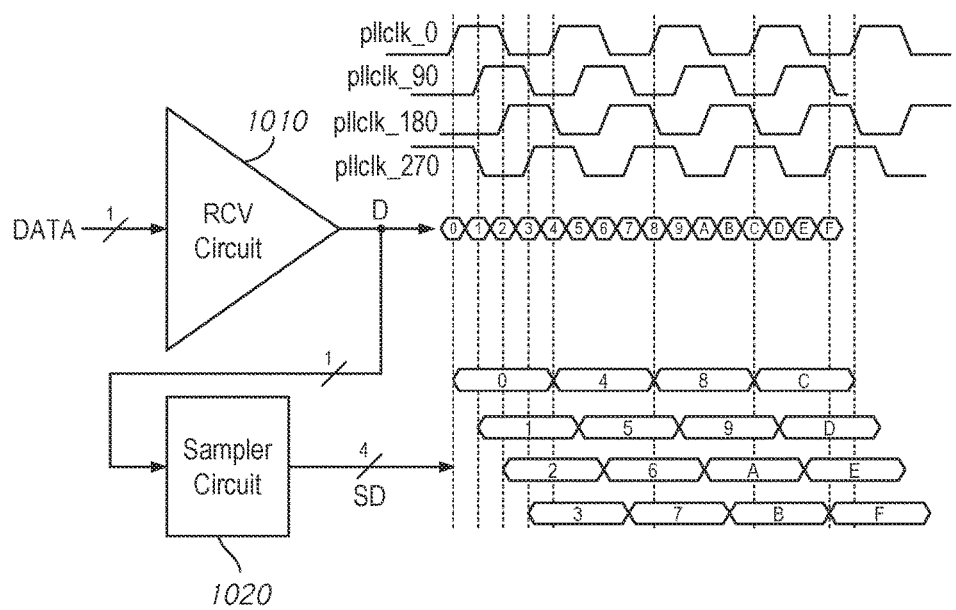
FIG. 11 is a diagram illustrating the relative timing of various clock signals, serially provided internal data, and sampled data according to an embodiment of the disclosure.

FIG. 11 is a diagram illustrating the relative timing of the pllclk clock signals, the serially provided internal data D from the receiver circuit 1010, and the sampled data SD provided by the sampler circuit 1020 according to an embodiment of the disclosure. In the embodiment illustrated in FIG. 11, the receiver circuit 1010 serially receives 16 bits of data and serially provides a corresponding 16 bits of internal data D. Four bits of internal data D are provided per clock cycle of the pllclk clock signals, and the sampler circuit 1020 provides four bits of sampled data SD in parallel, with each bit provided over one clock cycle of the pllclk clock signals. As the receiver circuit 1010 serially provides the internal data D, the rising edge of the pllclk_0 clock signal causes the sampler circuit 1020 to sample data bit 0 of the internal data D and provide sampled data bit 0 over one clock cycle of the pllclk_0 clock signal. The rising edge of the pllclk_90 clock signal causes the sampler circuit 1020 to sample data bit 1 of the internal data D and provide sampled data bit 1 over one clock cycle of the pllclk_90 clock signal. The rising edge of the pllclk_180 clock signal causes the sampler circuit 1020 to sample data bit 2 of the internal data D and provide sampled data bit 2 over one clock cycle of the pllclk_180 clock signal. The rising edge of the pllclk_270 clock signal causes the sampler circuit 1020 to sample data bit 3 of the internal data D and provide sampled data bit 3 over one clock cycle of the pllclk_270 clock signal. The next rising edge of the pllclk_0 clock signal causes the sampler circuit 1020 to sample data bit 4 of the internal data D and provide sampled data bit 4 over one clock cycle of the pllclk_0 clock signal. The sampling of the internal data D and providing a corresponding sampled data bit responsive to the rising edges of the pllclk_0, pllclk_90, pllclk_180, and pllclk_270 clock signals continues until the 16 bits of serially provided internal data D have been sampled (over four clock cycles of the pllclk clock signals).

As illustrated by FIG. 11, the sampler circuit 1020 serially receives 16 bits of internal data D, four bits of data per clock cycle of the pllclk clock signals, and provides four bits of sampled data SD in parallel, each bit of the sampled data provided over one clock cycle of the pllclk clock signals.

With reference to FIG. 10, the sampled data SD is provided to a serial-to-parallel (S2P) circuit 1030. The S2P circuit 1030 further receives the four pllclk clock signals and a write enable signal wren. Four delayed pllclk clock signals are also provided to the S2P circuit 1030. The four delayed pllclk clock signals are provided by a delay circuit 1040 that delays the four pllclk clock signals. The S2P circuit 1030 receives the sampled data SD responsive to the pllclk clock signals and provides corresponding bits of data in parallel responsive to an active write enable signal wren. In an embodiment of the disclosure, 16 bits of sampled data SD are received by the S2P circuit 1030. The 16 bits of sampled data SD are received as four bits in parallel for each clock cycle of pllclk clock signals, and over four clock cycles of the pllclk signals, as previously described with reference to FIG. 11. After the 16 bits of sampled data SD have been received by the S2P circuit 1030, 16 corresponding bits of data are provided in parallel by activation of the write enable signal wren.

In summary, the write data input circuit 1000 receives bits of data serially (e.g., four bits of data per clock cycle of the pllclk clock signals) and provides corresponding bits of data in parallel. In an embodiment, 16 bits of data are received by the write data input circuit 1000 over four clock cycles of the pllclk clock signals, and 16 corresponding bits of data are provided in parallel thereafter. As previously described, the pllclk_0, pllclk_90, pllclk_180, and pllclk_270 clock signals provided to the write data input circuit 1000 may be the four phase clock signals IO0, IO090, IO180, and IO270. The IO clock signals may be provided, for example, by a clock divider circuit. The IO clock signals may have a first clock frequency in a first mode (e.g., DDR mode) and have a higher second clock frequency in a second mode (e.g., QDR mode).

Figure 12:
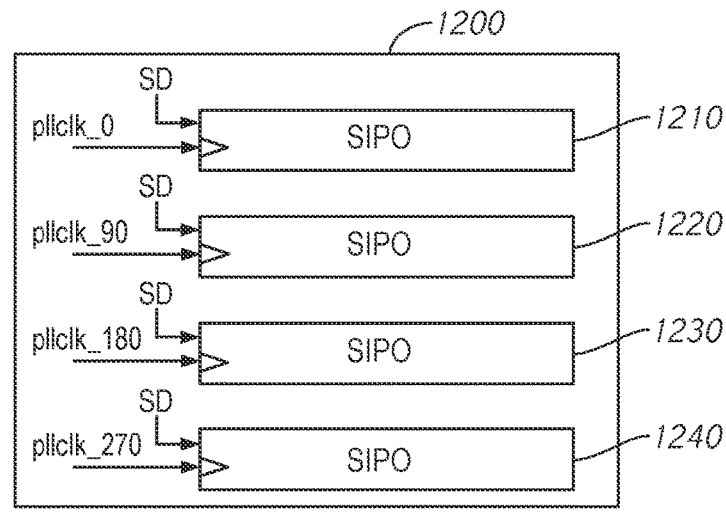
FIG. 12 is a block diagram of a serial-to-parallel (S2P) circuit according to an embodiment of the disclosure.

FIG. 12 is a block diagram of a serial-to-parallel (S2P) circuit 1200 according to an embodiment of the disclosure. The S2P circuit 1200 may be used for the S2P circuit 1030 in an embodiment. The S2P circuit 1200 includes serial-in-parallel-out (SIPO) circuits 1210, 1220, 1230, and 1240. Each SIPO circuit receives a respective one of the four pllclk clock signals. As shown in FIG. 12, the SIPO circuit 1210 receives the pllclk_0 clock signal, the SIPO circuit 1220 receives the pllclk_90 clock signal, the SIPO circuit 1230 receives the pllclk_180 clock signal, and the SIPO circuit 1240 receives the pllclk_270 clock signal. Each of the SIPO circuits serially receives four bits of sampled data SD responsive to the respective pllclk clock signal and provides four corresponding bits in parallel. For example, in an embodiment where the S2P circuit 1200 receives 16 bits of sampled data SD as four bits in parallel for each clock cycle of pllclk clock signals, and over four clock cycles of the pllclk signals, each SIPO circuit receives four bits of sampled data serially and provides a corresponding four bits of data in parallel. The four SIPO circuits 1210, 1220, 1230, and 1240 provide a total of 16 bits of data in parallel.

Figure 13A:
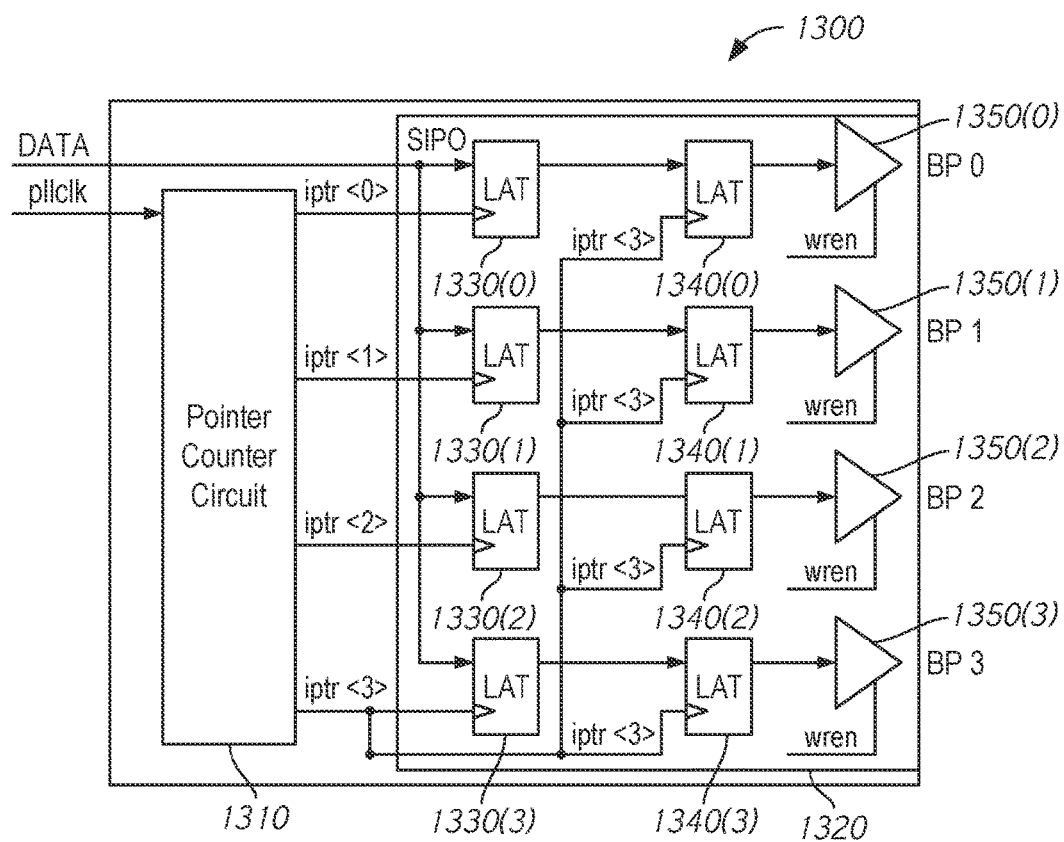
FIG. 13A is a block diagram of a serial-in-parallel-out (SIPO) circuit according to an embodiment of the disclosure.

FIG. 13A is a block diagram of a serial-in-parallel-out (SIPO) circuit 1300 according to an embodiment of the disclosure. The SIPO circuit 1300 may be used for the SIPO circuit 1210, 1220, 1230, and 1240. The SIPO circuit 1300 includes a pointer counter circuit 1310 that receives a pllclk clock signal and provides pointer signals iptr<0>, iptr<1>, iptr<2>, and iptr<3>. The pointer counter circuit 1310 sequentially provides one active pointer signal responsive to the pllclk clock signal. The SIPO circuit 1300 further includes a SIPO block 1320. The SIPO block includes latches 1330(0)-1330(3) and 1340(0)-1340(3), and buffers 1350(0)-1350(3). The latch 1330(0) latches and provides data responsive to an active pointer signal iptr<0>, the latch 1330(1) latches and provides data responsive to an active pointer signal iptr<1>, the latch 1330(2) latches and provides data responsive to an active pointer signal iptr<2>, and the latch 1330(3) latches and provides data responsive to an active pointer signal iptr<3>. The latches 1340(0)-1340(3) latch and provide respective data responsive to an active pointer signal iptr<3>. The buffers 1350(0)-1350(3) are concurrently activated by an active write enable signal wren to output data BP0-BP3 in parallel, which correspond to the data of the latches 1340(0)-1340(3).

Figure 13B:
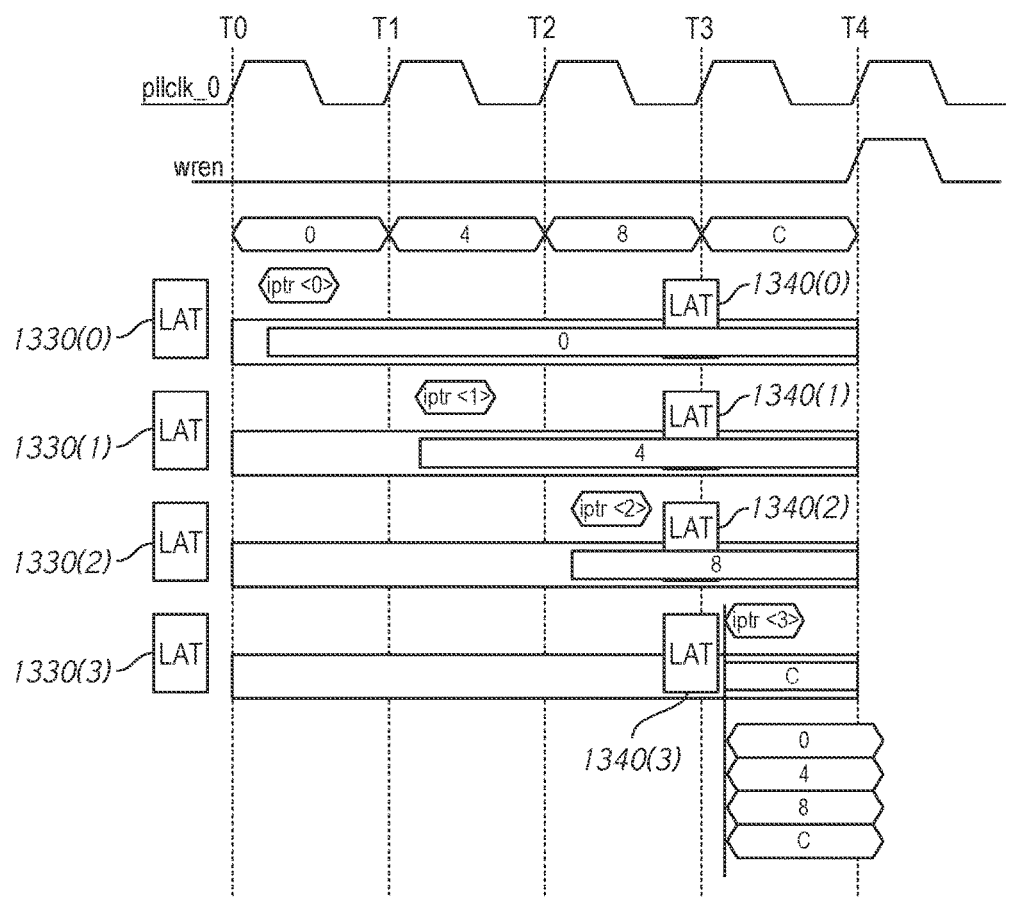
FIG. 13B is a timing diagram illustrating the various signals during operation of the SIPO circuit of FIG. 13A according to an embodiment of the disclosure.

FIG. 13B is a timing diagram illustrating the various signals during operation of the SIPO circuit 1300 according to an embodiment of the disclosure. The various signals illustrated by FIG. 13B are for the SIPO circuit 1300 when used as the SIPO circuit 1210 of FIG. 12.

As previously described with reference to FIGS. 10 and 11, bit 0, bit 4, bit 8, and bit C of the bits of sampled data SD are provided by the sampler circuit 1020 over four clock cycles of the pllclk_0 clock signal. With reference to FIG. 13B, a rising edge of the pllclk_0 clock signal at time T0 causes the pointer counter circuit 1310 to provide an active pointer signal iptr<0> to cause the latch 1330(0) to latch bit 0 of the sampled data SD and provide the same to the latch 1340(0). A rising edge of the pllclk_0 clock signal at time T1 causes the pointer counter circuit 1310 to provide an active pointer signal iptr<1> to cause the latch 1330(1) to latch bit 4 of the sampled data SD and provide the same to the latch 1340(1). A rising edge of the pllclk_0 clock signal at time T2 causes the pointer counter circuit 1310 to provide an active pointer signal iptr<2> to cause the latch 1330(2) to latch bit 8 of the sampled data SD and provide the same to the latch 1340(2). A rising edge of the pllclk_0 clock signal at time T3 causes the pointer counter circuit 1310 to provide an active pointer signal iptr<3> to cause the latch 1330(3) to latch bit C of the sampled data SD and provide the same to the latch 1340(3). The rising edge of the pllclk_0 clock signal at time T3 also causes the latches 1340(0)-1340(3) to latch and provide the respective input data and provide the same to a respective buffer 1350(0)-1350(3). A rising edge of the pllclk_0 clock signal at time T4 causes the write enable signal wren to activate the buffers 1350(0)-1350(3) to provide the respective bit of data. As illustrated by the previous example, four bits of sampled data provided to the SIPO circuit 1300 serially are latched responsive to the pllclk clock signal and then provided in parallel.

Figure 14:
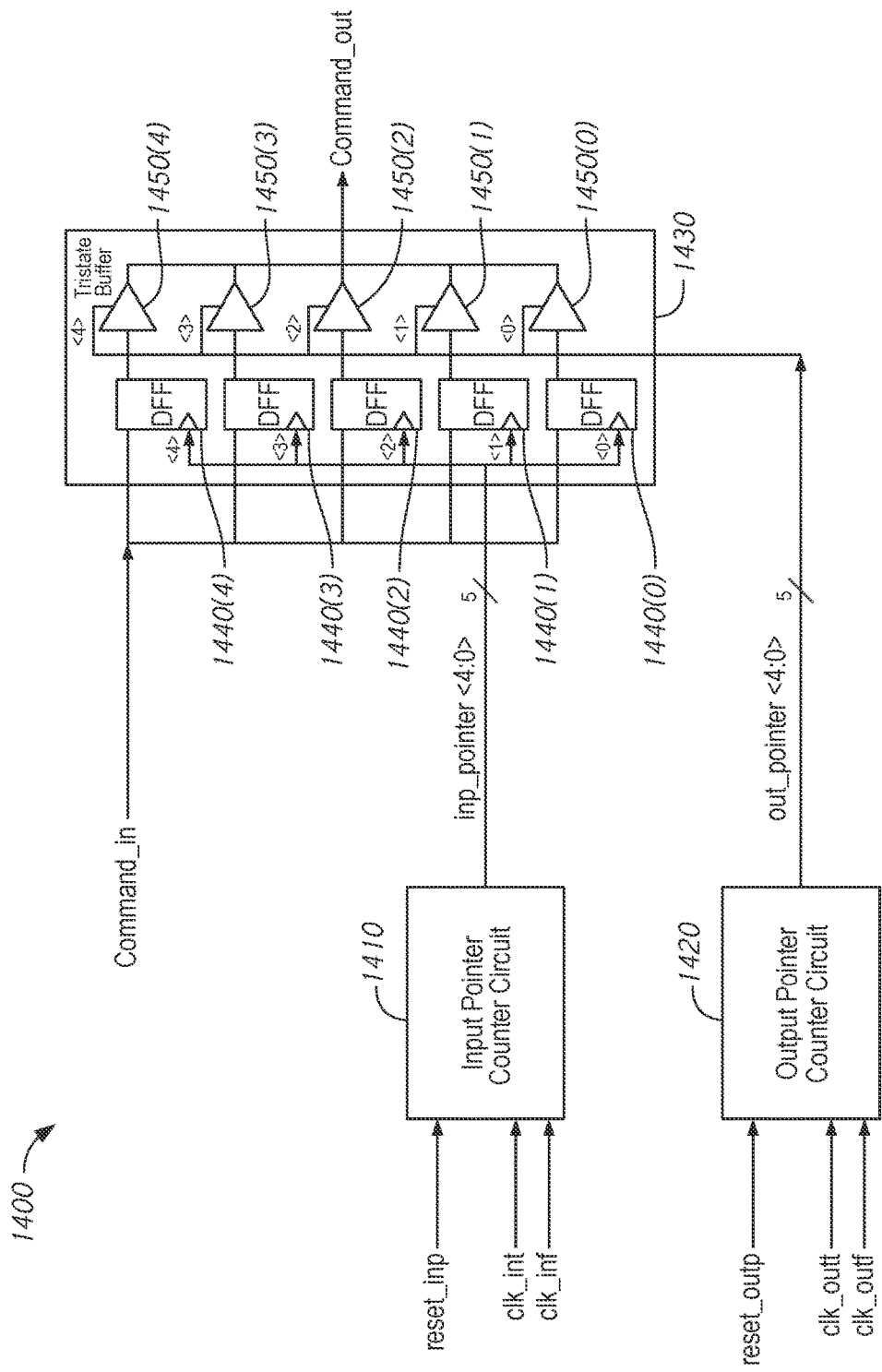
FIG. 14 is a block diagram of a command buffer according to an embodiment of the disclosure.

FIG. 14 is a block diagram of a command buffer 1400 according to an embodiment of the disclosure. The command buffer 1400 may be implemented as a first-in, first-out (FIFO) buffer. The command buffer 1400 includes a input pointer counter circuit 1410 and an output pointer counter circuit 1420. The input pointer counter circuit 1410 receives complementary clock signals clk_int and clk_inf, and further receives an input pointer counter reset signal reset_inp. The input pointer counter circuit 1410 provides an active input pointer signal inp_pointer responsive to the clk_int and clk_inf clock signals. For example, responsive to first clock transitions of the clk_int and clk_inf clock signals (e.g., the clk_int clock signal transitions to a high clock level and the clk_inf clock signal transitions to a low clock level) the input pointer counter circuit 1410 provides an active inp_pointer<0> signal with all other inp_pointer signals inactive. Responsive to second clock transitions of the clk_int and clk_inf clock signals, the input pointer counter circuit 1410 provides an active inp_pointer<1> signal with all other inp_pointer signals inactive. The next clock transitions result in an active inp_pointer<2> signal, and so on. In an embodiment of the disclosure, the input pointer signals includes five input pointer signals inp_pointer<0>, inp_pointer<1>, inp_pointer<2>, inp_pointer<3>, and inp_pointer<4>. The input pointer counter circuit 1410 is reset to a known state (e.g., providing an active inp_pointer<0> signal with all other inp_pointer signals inactive) by an active reset signal reset_inp.

The output pointer counter circuit 1420 receives complementary clock signals clk_outt and clk_outf, and further receives an output pointer counter reset signal reset_outp. The output pointer counter circuit 1420 provides an active output pointer signal outp_pointer responsive to the clk_outt and clk_outf clock signals. For example, responsive to first clock transitions of the clk_outt and clk_outf clock signals (e.g., the clk_outt clock signal transitions to a high clock level and the clk_outf clock signal transitions to a low clock level) the output pointer counter circuit 1420 provides an active outp_pointer<0> signal with all other outppointer signals inactive. Responsive to second clock transitions of the clk_outt and clk_outf clock signals, the output pointer counter circuit 1420 provides an active outp_pointer<1> signal with all other outp_pointer signals inactive. The next clock transitions result in an active outp_pointer<2> signal, and so on. In an embodiment of the disclosure, the output pointer signals includes five output pointer signals outp_pointer<0>, outp_pointer<1>, outp_pointer<2>, outp_pointer<3>, and outp_pointer<4>. The output pointer counter circuit 1420 is reset to a known state (e.g., providing an active outp_pointer<0> signal with all other outp_pointer signals inactive) by an active reset signal reset_outp.

The input and output pointer signals are provided to a buffer block 1430. The buffer block 1430 receives input commands command_in that are buffered responsive to an active input pointer signal and receives commands command_out that are provided by the buffer block 1430 responsive to an active output pointer signal. In this manner, the commands are buffered according to the timing of the clk_int and clk_inf clock domain and the commands are provided according to the timing of the clk_outt and clk_outf clock domain. The buffer block 1430 includes D flip flops (DFFs) 1440(0)-1440(4) and buffers 1450(0)-1450(4). In an embodiment, the buffers 1450(0)-1450(4) may be tristate buffers. A tristate buffer has a high impedance when deactivated, and provides an output based on the input when activated.

Each DFF 1440(0)-1440(4) is clocked by a respective input pointer signal inp_pointer to capture an input command and provide the command to a respective buffer 1450(0)-1450(4). For example, the DFF 1440(0) captures a command (i.e., command_in) and provides the command to the buffer 1450(0) responsive to the input pointer signal inp_pointer<0>, the DFF 1440(1) captures a command (i.e., command_in) and provides the command to the buffer 1450(1) responsive to the input pointer signal inp_pointer<1>, the DFF 1440(2) captures a command (i.e., command_in) and provides the command to the buffer 1450(2) responsive to the input pointer signal inp_pointer<2>, and so on. Each buffer 1450(0)-1450(4) is activated responsive to a respective output pointer signal outp_pointer to provide the command at its input as provided by a respective DFF 1440. For example, the buffer 1450(0) is activated and provides a respective command responsive to the output pointer signal outp_pointer<0>, the buffer 1450(1) is activated and provides a respective command responsive to the output pointer signal outp_pointer<1>, the buffer 1450(2) is activated and provides a respective command responsive to the output pointer signal outp_pointer<2>, and so on.

In the embodiment of FIG. 14, the command buffer 1400 has a depth of five. That is, the command buffer 1400 can buffer five commands before writing over the earliest buffered command.

In operation, the command_in commands are captured by an activated one of the DFFs 1440 responsive to the clk_int and clk_inf clock signals. The clk_int and clk_inf clock signals cause the input pointer counter circuit 1410 to provide an active input pointer to clock one of the DFFs 1440 to capture the command_in command. The input pointers are activated sequentially, so that command_in commands may be captured by the DFFs 1440 as the clk_int and clk_inf clock signals clocks between high and low clock levels. The command buffer 1400 provides commands from the latches 1440(0)-1440(4) one at a time by controlling activation of the buffers 1450(0)-1450(4) with the output pointer signals outp_pointer responsive to the clk_outt and clk_outf clock signals. As the clk_outt and clk_outf clock signals clock between high and low clock signals the output pointer counter circuit 1420 sequentially provides an active output pointer signal outp_pointer to activate a respective buffer 1450.

The command buffer 1400 may be used as the read command buffer 114. In an embodiment where the command buffer 1400 is used as the read command buffer 114, the clk_int and clk_inf clock signals may be the internal clock signals CACLK and CACLKF, and the clk_outt and clk_outf clock signals may be the BUFCLK and BUFCLKF clock signals. The command_in commands may be the RDCMD read commands. The command buffer 1400 may be used as the write command buffer 114. In an embodiment where the command buffer 1400 is used as the write command buffer 112, the clk_int and clk_inf clock signals may be the internal clock signals CACLK and CACLKF, and the clk_outt and clk_outf clock signals may be the BUFCLK and BUFCLKF clock signals. The command_in commands may be the WRCMD write commands.

Figure 15:
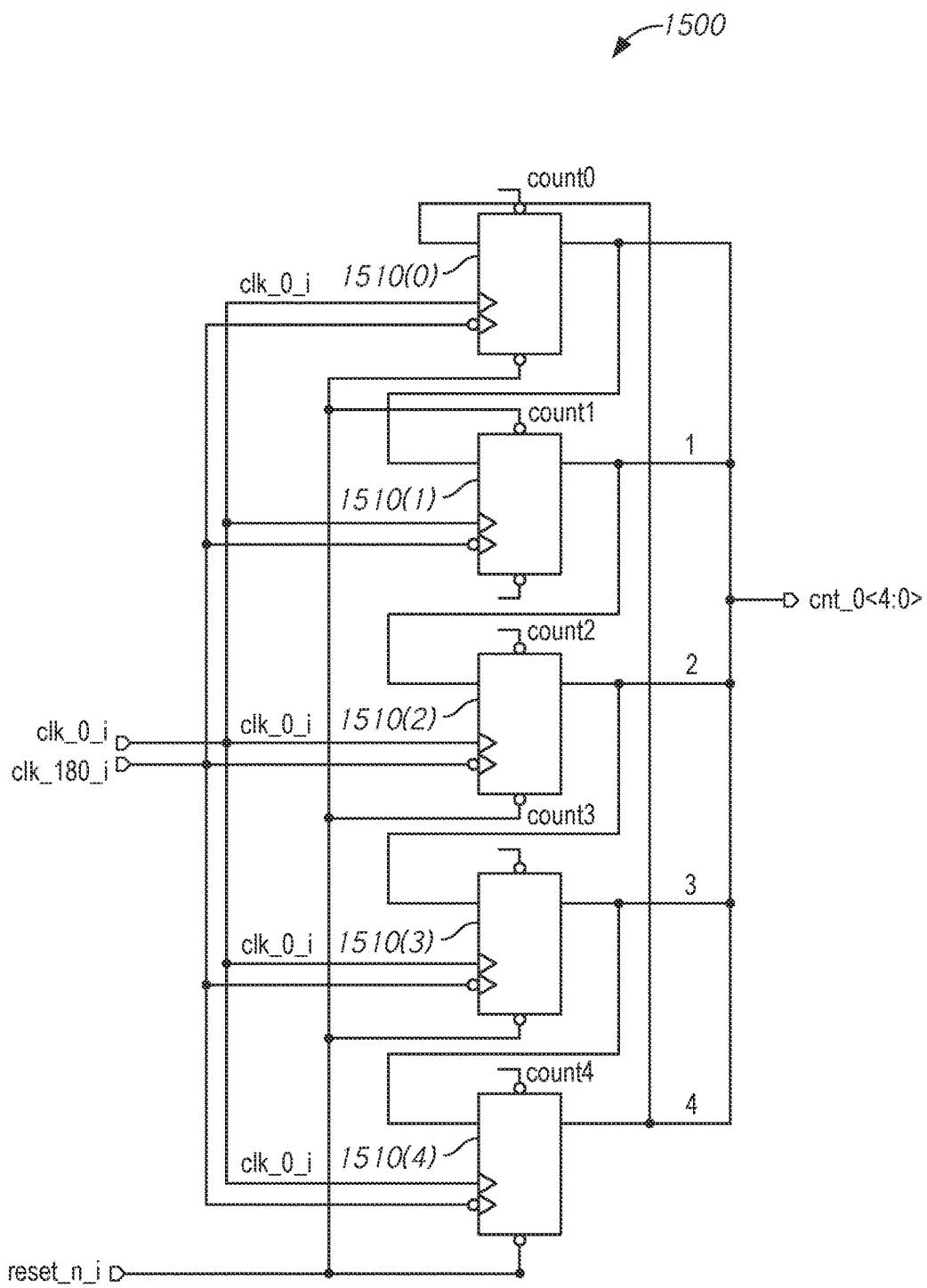
FIG. 15 is a block diagram of a pointer counter circuit according to an embodiment of the disclosure.

FIG. 15 is a block diagram of a counter circuit 1500 according to an embodiment of the disclosure. The counter circuit 1500 is a five-bit counter that provides one active value responsive to the complementary clock signals clk_0_i and clk_180_i. The counter circuit 1500 includes D flip flops (DFFs) 1510(0)-1510(4). The DFFs 1510(0)-1510(4) receive the clk_0_i and clk180_i clock signals. A reset signal reset_n_i is provided to the DFF 1510(4) to reset the counter circuit to a known value. In an embodiment of the disclosure, the counter circuit 1500 may be used for the input pointer counter circuit 1410, and also used as the output pointer counter circuit 1420. In such an embodiment, the clk_0_i and clk180_i clock signals for use as an input pointer counter circuit 1410 are provided by the clk_int and clk_inf clock signals, and the reset_n_i signal is provided by the reset_inp signal. The clk_0_i and clk180_i clock signals when the counter circuit 1500 is used use as an input pointer counter circuit 1420 are provided by the clk_outt and clk_outf clock signals, and the reset_n_i signal is provided by the reset_outp signal.

In operation, as the clk_0_i and clk_180_i clock signals clock between high and low clock levels, an active value (e.g., high logic level) propagates through the DFFs 1510(0)-1510(4) and wraps around when reaching the DFF 1510(4). For example, responsive to a first rising edge of the clk_0_i clock signal (and a falling edge of the clk_180_i clock signal), the DFF 1510(0) provides a high logic level output and the remaining DFFs 1510(1)-1510(4) provide a low logic level output (i.e., the output count cnt_0<4:0> is 00001). The high logic level of the DFF 1510(0) is also provided to the input of the DFF 1510(1) and the low logic level of the DFF 1510(4) is provided to the input of the DFF 1510(0). Responsive to a second rising edge of the clk_0_i clock signal (and a falling edge of the clk_180_i clock signal), the DFF 1510(1) provides a high logic level output because of the high logic level from the DFF 1510(0), and the remaining DFFs 1510(0) and 1510(2)-1510(4) provide a low logic level output (i.e., the output count cnt_0<4:0> is 00010). The high logic level of the DFF 1510(1) is also provided to the input of the DFF 1510(2) and the low logic level of the DFF 1510(0) is provided to the input of the DFF 1510(1). Responsive to a third rising edge of the clk_0_i clock signal (and a falling edge of the clk_180_i clock signal), the DFF 1510(2) provides a high logic level output because of the high logic level from the DFF 1510(1), and the remaining DFFs 1510(0), 1510(1), 1510(3), and 1510(4) provide a low logic level output (i.e., the output count cnt_0<4:0> is 00100). As the clk_0_i and clk_180_i clock signals continue to clock between high and low clock levels the high logic level output propagates through the DFFs.

From the foregoing it will be appreciated that, although specific examples have been described herein for purposes of illustration, various modifications may be made without deviating from the scope of the disclosure. That is, specific examples have been described with reference to the Figures, however, these specific examples have been provided by way of example, and are not intended to limit the scope of the disclosure to the specific examples. For example, specific numbers of clock signals have been previously described for some of the Figures. However, the specific numbers of clock signals were provided merely as examples, and do not limit the scope of the disclosures to those embodiments having the specific numbers of clock signals. For example, with reference to FIGS. 2 and 5, rather than using two command and address clock signals CACLK, CACLKF, and two buffer clock signals BUFCLK, BUFCLKF for write and read command buffers 112 and 114, another embodiment may use one command address clock signal and one buffer clock signal. In another example, the read data output circuit 118 is described as receiving 16 bits of data and the write data input circuit 120 is described as providing 16 bits of data, in another embodiment the read data output circuit may receive greater or fewer bits of data, and the write data input circuit may provide greater or fewer bits of data. Generally, as previously discussed, describing details of specific examples is not intended to limit the scope of the disclosure to those specific examples. Accordingly, the scope of the disclosure should not be limited except as by the appended claims.

What is claimed is:

1. An apparatus, comprising:
   a read command buffer configured to buffer a read command responsive to a first clock signal and configured to provide a buffered read command responsive to a second clock signal;
   a read data output circuit configured to receive a plurality of bits of data in parallel when activated by the buffered read command, and to provide the plurality of bits of data serially responsive to input/output (IO) clock signals; and
   a data clock timing circuit configured to provide the IO clock signals having a first clock frequency in a first mode and provide the IO clock signals having a second clock frequency in a second mode, and further configured to provide the second clock signal having the first clock frequency in the first and second modes.

2. The apparatus of claim 1 wherein the first mode is a double data rate mode and the second mode is a quad data rate mode.

3. The apparatus of claim 1 wherein the first clock frequency is one-half of the second clock frequency.

4. The apparatus of claim 1 wherein the first clock signal is in a first clock domain and wherein the second clock signal is in a second clock domain that is different than the first clock domain.

5. The apparatus of claim 1 wherein the first clock signal is based on a command and address clock signal and the second clock signal is based on a write clock signal having a different clock frequency than the command and address clock signal.

6. The apparatus of claim 1 wherein the a data clock timing circuit is configured to provide IO clock signals including four clock signals having relative phases to each other.

7. The apparatus of claim 6 wherein the four clock signals are 90 degrees out of phase from each other.

8. The apparatus of claim 1, further comprising:
- a write command buffer configured to buffer a write command responsive to the first clock signal and configured to provide the write command responsive to the second clock signal; and
- a write data output circuit configured to serially receive a plurality of bits of data when activated by the write command from the write command buffer, and to provide the plurality of bits of data in parallel responsive to the input/output (IO) clock signals.

9. The apparatus of claim 1 wherein the first clock signal includes complementary clock signals and wherein the second clock signals includes complementary clock signals.

* * * * *